(12) United States Patent
Chang et al.

(10) Patent No.: US 11,658,213 B2
(45) Date of Patent: May 23, 2023

(54) SUPERLATTICE FILMS FOR PHOTONIC AND ELECTRONIC DEVICES

(71) Applicant: Northwestern University, Evanston, IL (US)

(72) Inventors: Robert P. H. Chang, Glenview, IL (US); Woongkyu Lee, Evanston, IL (US)

(73) Assignee: Northwestern University, Evanston, IL (US)

( * ) Notice: Subject to any disclaimer, the term of this patent is extended or adjusted under 35 U.S.C. 154(b) by 109 days.

(21) Appl. No.: 17/254,499

(22) PCT Filed: Jun. 24, 2019

(86) PCT No.: PCT/US2019/038721
§ 371 (c)(1),
(2) Date: Dec. 21, 2020

(87) PCT Pub. No.: WO2019/246618
PCT Pub. Date: Dec. 26, 2019

(65) Prior Publication Data
US 2021/0126091 A1 Apr. 29, 2021

Related U.S. Application Data

(60) Provisional application No. 62/688,812, filed on Jun. 22, 2018.

(51) Int. Cl.
*H01L 29/15* (2006.01)
*H01L 21/02* (2006.01)
*H01L 29/24* (2006.01)

(52) U.S. Cl.
CPC ...... *H01L 29/152* (2013.01); *H01L 21/02175* (2013.01); *H01L 21/02565* (2013.01); *H01L 29/24* (2013.01)

(58) Field of Classification Search
CPC ............ H01L 29/152; H01L 21/02175; H01L 21/02565; H01L 29/24; H01L 21/02507; H01L 21/02631; C30B 29/68
See application file for complete search history.

(56) References Cited

U.S. PATENT DOCUMENTS 7,432,116 B2   10/2008   Yamazaki
7,910,177 B2    3/2011   Li
(Continued)

OTHER PUBLICATIONS

Ohmoto et al., "Pulsed laser deposition of thin films and superlattices based on ZnO,"Semicond. Sci. Technol. 20 (2005) S1-S12 (Year: 2005).*
(Continued)

*Primary Examiner* — Julia Slutsker
(74) *Attorney, Agent, or Firm* — Quarles & Brady LLP

(57) ABSTRACT

Superlattices and methods of making them are disclosed herein. The superlattices are prepared by irradiating a sample to prepare an alternating superlattice of layers of a first material and a second material, wherein the ratio of the first deposition rate to the second deposition rate is between 1.0:2.0 and 2.0:1.0. The superlattice comprises a multiplicity of alternating layers, wherein the multiplicity of layers of the first material have a thickness between 0.1 nm and 50.0 nm or the multiplicity of layers of the second material have a thickness between 0.1 nm and 50.0.

10 Claims, 20 Drawing Sheets

(56) References Cited

U.S. PATENT DOCUMENTS

| | | | |
|---|---|---|---|
| 2006/0128127 A1 | 6/2006 | Seo | |
| 2007/0163503 A1 | 7/2007 | Jun | |
| 2014/0261604 A1* | 9/2014 | Jha | H01L 35/22 |
| | | | 136/200 |
| 2015/0126007 A1 | 5/2015 | Jang | |
| 2016/0298781 A1 | 10/2016 | Brondum | |

OTHER PUBLICATIONS

Christen et al., "Epitaxial superlattices grown by a PLD-based continuous compositional-spread technique," Applied Surface Science 189 (2002), pp. 216-221 (Year: 2002).*
Abb, M., et al. All-Optical Control of a Single Plasmonic Nanoantenna—ITO Hybrid. Nano Lett 11, 2457-2463, (2011).
Ahn, C. H., et al. Artificial semiconductor/insulator superlattice channel structure for high-performance oxide thin-film transistors. Scientific reports 3, (2013).
Akbari, A. et al. Schottky contact surface-plasmon detector integrated with an asymmetric metal stripe waveguide. Applied Physics Letters 95, 021104, (2009).
Boltasseva, A. et al. "Low-loss plasmonic metamaterials." Science 331.6015 (2011): 290-291.
Brongersma, M. L., et al. Plasmon-induced hot carrier science and technology. Nat Nano 10, 25-34, (2015).
Buchholz, D. B., et al. "The Structure and Properties of Amorphous Indium Oxide." Chemistry of Materials 26.18 (2014): 5401.
Buchholz, D. B., et al. Control and Characterization of the Structural, Electrical, and Optical Properties of Amorphous Zinc-Indium-Tin Oxide Thin Films. Acs Applied Materials & Interfaces 1, 2147-2153, (2009).
Buchholz, D. B., et al. Differences between amorphous indium oxide thin films. Progress in Natural Science-Materials International 23, 475-480, (2013).
Buono-Core et al., Synthesis and characterization of thin molybdenum oxide films prepared from molybdenum dioxo tropolonate precursors by photochemical metal-organic deposition (PMOD) and its evaluation as ammonia gas sensors. J. Non-Cryst. Solids 387, 21-27 (2014).
Cai, X., et al. Plasmon-Enhanced Terahertz Photodetection in Graphene. Nano Letters 15, 4295-4302, (2015).
Chen, X., et al. Scaling the Artificial Polariton Bandgap at Infrared Frequencies Using Indium Tin Oxide Nanorod Arrays. Advanced Optical Materials, (2016).
Chiang, et al, The Synthesis of a-MoO3 by Ethylene Glycol. Materials 6, (2013).
Choi, W. S., et al. Resonant tunnelling in a quantum oxide superlattice. Nature Communications 6, 7424, (2015).
Mariotti, et al, Monoclinic β-MoO 3 nanosheets produced by atmospheric microplasma: application to lithium-ion batteries. Nanotechnology 19, 495302 (2008).
Del Fatti, N., et al. Electron dynamics and surface plasmon resonance nonlinearities in metal nanoparticles. Chemical Physics 251, 215-226, (2000).
Dimmich, R. Electronic transport properties of metallic multi-layer films. Journal of Physics F: Metal Physics 15, 2477, (1985).
Dingle, et al, Electron mobilities in modulation-doped semiconductor heterojunction superlattices. Appl. Phys. Lett. 33, 665-667 (1978).
Diroll, B. T., et al. "Large transient optical modulation of epsilon-near-zero colloidal nanocrystals." ACS nano 10.11 (2016): 10099-10105.
Donley et al., Characterization of Indium-Tin Oxide Interfaces Using X-ray Photoelectron Spectroscopy and Redox Processes of a Chemisorbed Probe Molecule:? Effect of Surface Pretreatment Conditions. Langmuir 18, 450-457 (2002).
Garcia, G., et al. Dynamically Modulating the Surface Plasmon Resonance of Doped Semiconductor Nanocrystals. Nano Letters 11, 4415-4420, (2011).
Ge, J., et al. Plasmonic photodetectors based on asymmetric nanogap electrodes. Applied Physics Express 9, 084101, (2016).
Govorov, A. O. et al. Kinetic density functional theory for plasmonic nanostructures: breaking of the plasmon peak in the quantum regime and generation of hot electrons. The Journal of Physical Chemistry C 119, 6181-6194, (2015).
Guo, P., et al. "Gigahertz Acoustic Vibrations of Elastically Anisotropic Indium-Tin-Oxide Nanorod Arrays." Nano letters 16.9 (2016): 5639-5646.
Guo, P., et al. "Large optical nonlinearity of ITO nanorods for sub-picosecond all-optical modulation of the full-visible spectrum." Nature communications 7.1 (2016): 1-10.
Guo, P., et al. "Ultrafast switching of tunable infrared plasmons in indium tin oxide nanorod arrays with large absolute amplitude." Nature Photonics 10.4 (2016): 267-273.
Hartland, G. V. Optical Studies of Dynamics in Noble Metal Nanostructures. Chemical Reviews 111, 3858-3887, (2011).
Inoue, et al, Electron mobilities in modulation-doped AlxGa1-xAs/GaAs and pseudomorphic AxGa1-xAs/InyGa1-yAs quantum-well structures. Phys. Rev. B 47, 3771-3778 (1993).
International Searching Authority. International Search Report and Written Opinion for application PCT/US2019/038721. dated Oct. 29, 2019. 15 pages.
Ji et al., 2D-MoO3 nanosheets for superior gas sensors. Nanoscale 8, 8696-8703 (2016).
Khanal, R., et al. Composition-dependent structural and transport properties of amorphous transparent conducting oxides. Physical Review B 91, (2015).
Khurgin, J. B. et al. In search of the elusive lossless metal. Applied Physics Letters 96, 181102, (2010).
Khurgin, J. B. How to deal with the loss in plasmonics and metamaterials. Nature nanotechnology 10, 2-6, (2015).
Kim, et al, Low-temperature fabrication of high-performance metal oxide thin-film electronics via combustion processing. Ant. Mater. 10, 382 (2011).
Knight, M. W., et al. Photodetection with Active Optical Antennas. Science 332, 702-704, (2011).
Koehler, J. S. "Attempt to design a strong solid." Physical review B 2.2 (1970): 547.
Kuzik, L., et al. Optical and electrical properties of ultrathin metallic films. Soviet Journal of Experimental and Theoretical Physics 78, 114-118, (1994).
Lee, H. W., et al. Nanoscale Conducting Oxide PlasMOStor. Nano Letters 14, 6463-6468, (2014).
Li, S.-Q., et al. Broadband resonances in indium-tin-oxide nanorod arrays. Applied Physics Letters 107, 031104, (2015).
Li, S.-Q., et al. Infrared Plasmonics with Indium-Tin-Oxide Nanorod Arrays. Acs Nano 5, 9161-9170, (2011).
Li, S.-Q., et al. Plasmonic-Photonic Mode Coupling in Indium-Tin-Oxide Nanorod Arrays. ACS Photonics 1, 163-172, (2014).
Li, S.-Q., et al. Ultra-sharp plasmonic resonances from monopole optical nanoantenna phased arrays. Applied Physics Letters 104, 231101, (2014).
Lim, et al, Thermochemical hydrogen generation of indium oxide thin films. Aip Adv. 7, 035207 (2017).
Liu, J., et al. All-Amorphous-Oxide Transparent, Flexible Thin-Film Transistors. Efficacy of Bilayer Gate Dielectrics. Journal of the American Chemical Society 132, 11934-11942, (2010).
Liu, J., et al. High-Performance Flexible Transparent Thin-Film Transistors Using a Hybrid Gate Dielectric and an Amorphous Zinc Indium Tin Oxide Channel. Advanced Materials 22, 2333-2337, (2010).
Liu, X., et al. Quantification and impact of nonparabolicity of the conduction band of indium tin oxide on its plasmonic properties. Applied Physics Letters 105, 181117, (2014).
Mazor, et al, Columnar growth in thin films. Phys. Rev. Lett. 60, 424-427 (1988).
Mendez, et al, Resonant tunneling of holes in AlAs—GaAs—AlAs heterostructures. Appl. Phys. Lett. 47, 415-417 (1985).
Meyerovich, A. et al. Quantized systems with randomly corrugated walls and interfaces. Physical Review B 60, 9129, (1999).
Meyerovich, A. et al. Quantum size effect in conductivity of multilayer metal films. Physical Review B 67, 165411, (2003).

(56) References Cited

OTHER PUBLICATIONS

Meyerovich, A. et al. Surface roughness and size effects in quantized films. Physical Review B 65, 155413, (2002).
Miao, J., et al. Surface Plasmon-Enhanced Photodetection in Few Layer MoS2 Phototransistors with Au Nanostructure Arrays. Small 11, 2392-2398, (2015).
Mikhailov, G., et al. Influence of the quantum size effect for grazing electrons on the electronic conductivity of metal films. Journal of Experimental and Theoretical Physics Letters 66, 725-731, (1997).
Nagarajan, L., et al. A chemically driven insulator-metal transition in non-stoichiometric and amorphous gallium oxide. Nature materials 7, 391-398, (2008).
Nelson, Co-refinement of multiple-contrast neutron/X-ray reflectivity data using MOTOFIT. J. Appl. Crystallogr. 39, 273-276 (2006).
NIST. X-ray Photoelectron Spectroscopy Database; http://srdata.nist.gov/xps/. 2012.
Ortega, J., et al. Quantum-well states and magnetic coupling between ferromagnets through a noble-metal layer. Physical Review B 47, 1540, (1993).
Paggel, J., et al. Quantum-well states as Fabry-Pérot modes in a thin-film electron interferometer. Science 283, 1709-1711, (1999).
Reita, C., et al. Theory for field-effect mobility enhancement in multilayer structure thin-film transistors. Journal of Non-Crystalline Solids 115, 102-104, (1989).
Ruske, F., et al. Optical modeling of free electron behavior in highly doped ZnO films. Thin Solid Films 518, 1289-1293, (2009).
Saito, et al, Structure of thin amorphous MoO3 films prepared by vacuum-deposition. J. Cryst. Growth 79, 436-442 (1986).
Shokri Kojori, H., et al. Plasmon Field Effect Transistor for Plasmon to Electric Conversion and Amplification. Nano letters 16, 250-254, (2015).
Smith, D. et al. Theory of semiconductor superlattice electronic structure. Reviews of Modern Physics 62, 173, (1990).
Sun, C. K., et al. Femtosecond-tunable measurement of electron thermalization in gold. Physical Review B 50, 15337-15348, (1994).
Tice, D. B., et al. Ultrafast Modulation of the Plasma Frequency of Vertically Aligned Indium Tin Oxide Rods. Nano Letters 14, 1120-1126, (2014).
Torres, et al, XPS and X-ray diffraction characterization of MoO3 thin films prepared by laser evaporation. Phys. Status Solidi C 2, 3726-3729 (2005).
Trivedi, N. et al. Quantum size effects in transport properties of metallic films. Physical Review B 38, 12298, (1988).
Tsukazaki, A., et al. Observation of the fractional quantum Hall effect in an oxide. Nature materials 9, 889-893, (2010).
Voisin, C., et al. Ultrafast electron-electron scattering and energy exchanges in noble-metal nanoparticles. Physical Review B 69, 195416, (2004).
Walukiewicz, et al, Electron mobility in modulation-doped heterostructures. Phys. Rev. B 30, 4571-4582 (1984).
Wang, Y., et al. Ductile crystalline-amorphous nanolaminates. Proceedings of the National Academy of Sciences 104, 11155-11160, (2007).
Wang, Y., et al. Incipient plasticity in metallic glass modulated nanolaminates. Applied Physics Letters 91, 061924, (2007).
Wu, K., et al. Surface-plasmon enhanced photodetection at communication band based on hot electrons. Journal of Applied Physics 118, 063101, (2015).
Yashar, P., et al. Stabilization of cubic CrN0. 6 in CrN0. 6/TiN superlattices. Applied physics letters 72, (1998).
Yashar, P., et al. Structure and mechanical properties of polycrystalline CrN/TiN superlattices. Journal of Vacuum Science & Technology A 16, 2913-2918, (1998).
Yu et al., Preparation and characterization of In2O3 films with (111) preferred orientation. Vacuum 102, 63-66 (2014).
Yu, X. G., et al. Ultra-Flexible, "Invisible" Thin-Film Transistors Enabled by Amorphous Metal Oxide/Polymer Channel Layer Blends. Advanced Materials 27, 2390-2399, (2015).
Zakaria et al., Chemical Synthesis of Multilayered Nanostructured Perovskite Thin Films with Dielectric Features for Electric Capacitors. ACS Appl. Nano Mater. 1, 915-921 (2018).
Zavelani-Rossi, M., et al. Transient Optical Response of a Single Gold Nanoantenna: The Role of Plasmon Detuning. ACS Photonics 2, 521-529, (2015).
Zhang, et al, High-Mobility Transport Anisotropy in Few-Layer MoO3 and Its Origin. Acs Appl. Mater. Interfaces 9, 1702-1709 (2017).
Zheng, B. Y., et al. Distinguishing between plasmon-induced and photoexcited carriers in a device geometry. Nature Communications 6, 7797, (2015).
Zhou, et al, Model-independent method for reconstruction of scattering-length-density profiles using neutron or x-ray reflectivity data. Physical Review E 47, 3174-3190 (1993).
Zhou, N. J., et al. Diketopyrrolopyrrole (DPP) functionalized tetrathienothiophene (TTA) small molecules for organic thin film transistors and photovoltaic cells. Journal of Materials Chemistry C 3, 8932-8941, (2015).
Zhou, Quantitative analysis of the nonlinear relationship between neutron or x-ray reflectance and the scattering-length-density profile. Physical Review E 52, 1938-1952 (1995).

* cited by examiner

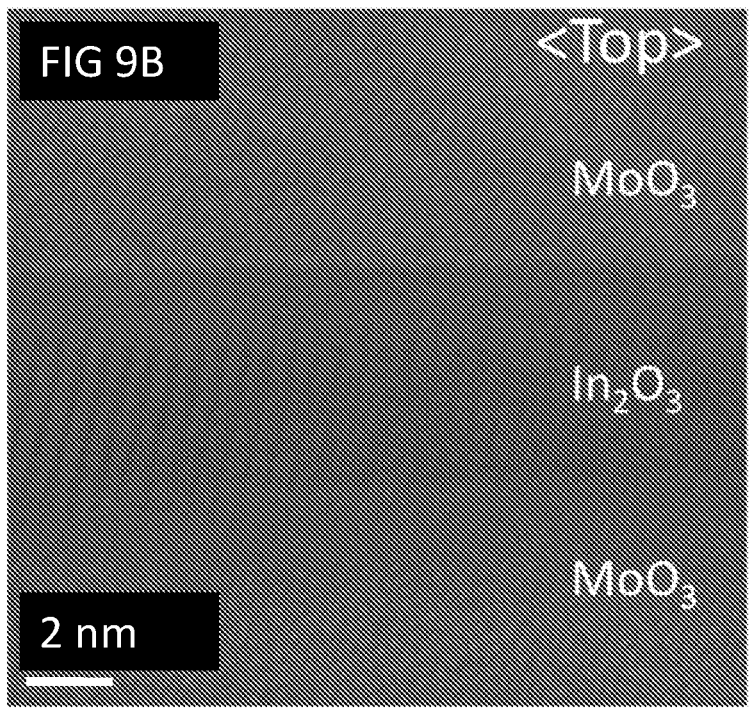
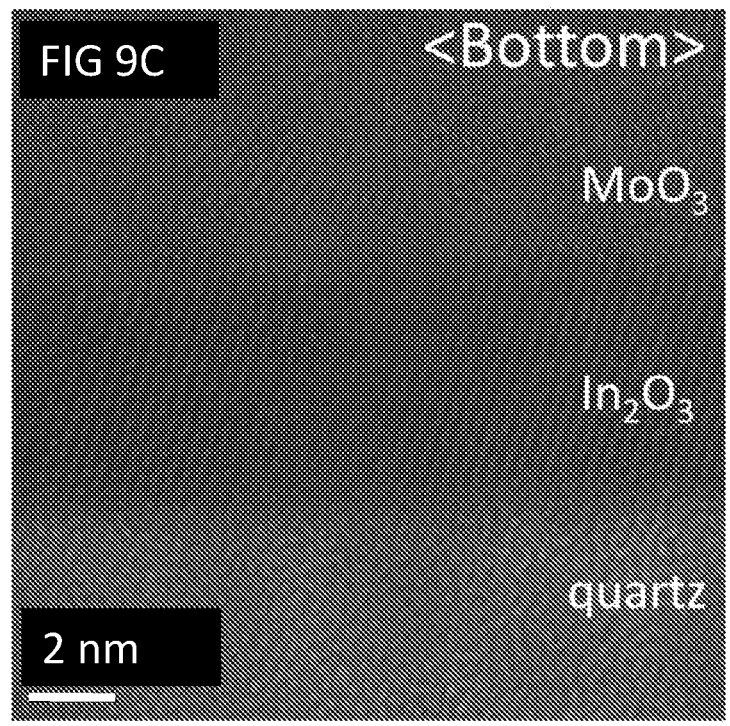

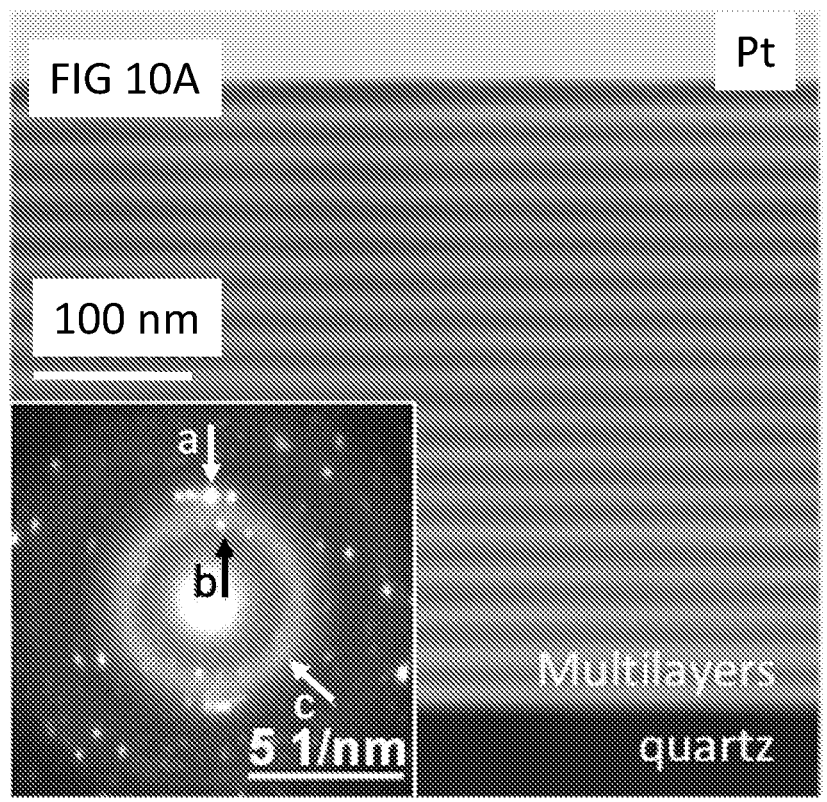
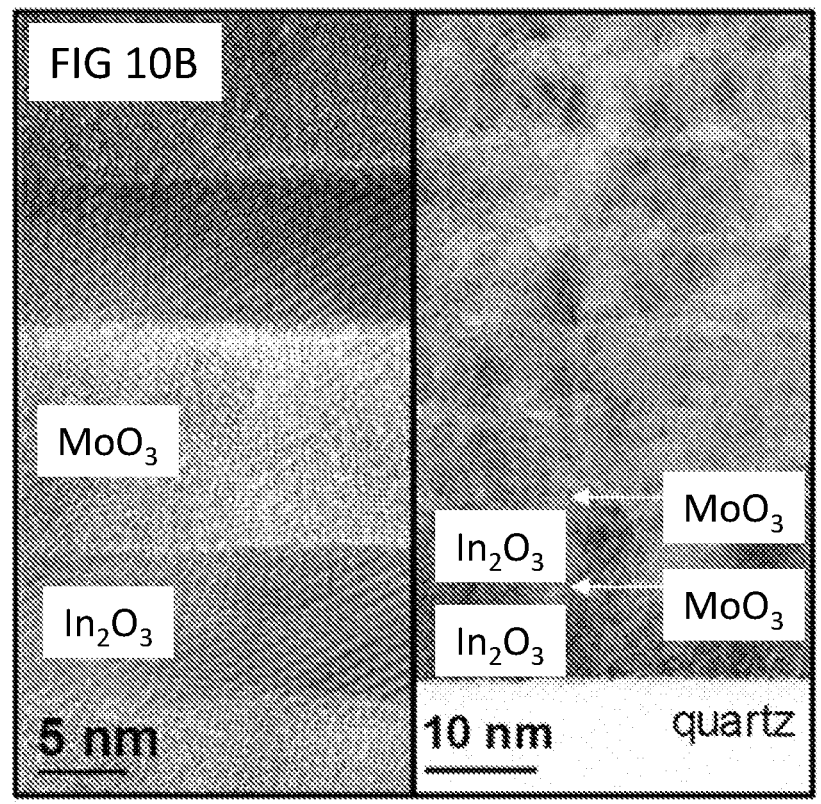

SUPERLATTICE FILMS FOR PHOTONIC AND ELECTRONIC DEVICES

CROSS-REFERENCE TO RELATED APPLICATIONS

This application represents the U.S. national stage entry of International Application PCT/US2019/038721 filed Jun. 24, 2019, which claims benefit of priority to U.S. Patent Application Ser. No. 62/688,812, filed Jun. 22, 2018, the contents of each are incorporated herein by reference in their entireties.

STATEMENT OF GOVERNMENT SUPPORT

This invention was made with government support under DMR1121262 awarded by the National Science Foundation. The government has certain rights in the invention.

BACKGROUND

Superlattices are multi-layer thin films with nanometer length dimensions. Superlattices were discovered in 1925 by Johansson and Linde in the copper-metal thin film system using X-ray diffraction. Over the decades, the rapid development of precision fabrication equipment has made possible the growth of high quality superlattice films for mechanical and photonic applications using a variety of materials from metals to oxides, nitrides, and semiconductors. Traditionally, superlattices have been prepared by molecular beam epitaxy (MBE) or organo-metallic chemical vapor deposition (OMCVD) to grow alternative epitaxial layers of crystalline materials, such as semiconducting materials. The performance of such structures relies heavily on maintaining the crystal quality as the number of layers, i.e., total thickness, increases. However, with the accumulating and unavoidable interfacial stress or strain, due to even a slight lattice miss-match between layers, defects will accrue with increasing total stack thickness. As a result, there exists a need for new methods for preparing superlattice films.

SUMMARY OF INVENTION

Disclosed herein are superlattice thin film structures for use in photonic and electrical devices and methods for making the same. One aspect is a method for preparing a superlattice. The method may comprise providing a chamber having a first material and a second material therein; positioning the first material in an irradiation zone within the chamber; irradiating the first material in the irradiation zone for an effective time to deposit a layer of the first material at a first deposition rate; positioning the second material in the irradiation zone; irradiating the second material in the irradiation zone for an effective time to deposit a layer of the second material at a second deposition rate; repeating steps (b)-(e) a multiplicity of times, thereby forming an alternating superlattice of layers of the first material and the second material, wherein the ratio of the first deposition rate to the second deposition rate is between 1.0:2.0 and 2.0:1.0. Suitably, the effective time to deposit the layer of the first material results in a layer of the first material between 0.1 nm and 50.0 nm thick or the effective time to deposit the layer of the second material results in a layer of the second material between 0.1 nm and 50.0 nm thick. In some embodiments, the effective time to deposit the layer of the first material results in a layer of the first material between 0.1 nm and 10.0 nm thick and the effective time to deposit the layer of the second material results in a layer of the second material between 0.1 nm and 10.0 nm thick.

Another aspect is a superlattice comprising a multiplicity of alternating layers of a first material and a second material, wherein the multiplicity of layers of the first material have a thickness between 0.1 nm and 50.0 nm or the multiplicity of layers of the second material have a thickness between 0.1 nm and 50.0, and wherein the first material has a first deposition rate, the second material has a second deposition rate, and the first deposition rate to the second deposition rate is between 1.0:2.0 and 2.0:1.0 under a substantially similar deposition condition. In some embodiments, the multiplicity of layers of the first material have a thickness between 0.1 nm and 10.0 nm and the multiplicity of layers of the second material have a thickness between 0.1 nm and 10.0 nm.

Each of the first material and the second material have a morphological characteristic and an electromagnetic characteristic. Suitably, the morphological characteristic may be independently selected from a crystalline material or an amorphous material. Suitably, the electromagnetic characteristic may be independently selected from a semiconductive material, a metallic material, a superconductive material, a magnetic material, or an insulating material. In some embodiments, wherein the first material and the second material have a different morphological characteristic. For example, one of the materials may be a crystalline material and the other may be an amorphous material. In some embodiments, wherein the first material and the second material have a different electromagnetic characteristic. For example, one of the materials may be a semiconductive material and the other may be an insulating material.

Another aspect are devices prepared from the materials and methods described herein. Suitably, electronic or photonotic devices, such as field effect transistors or photodetectors, may comprise any of the superlattices disclosed herein.

BRIEF DESCRIPTION OF DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention.

FIGS. 4A and 4B show the height profiles at the edges of the patterned $In_2O_3$ (FIG. 4A) and $MoO_3$ (FIG. 4B) films measured by a stylus profilometer. FIGS. 4C and 4D show the measured X-ray reflectivity spectra and the fitted results of $In_2O_3$ (FIG. 4C) and $MoO_3$ (FIG. 4D) films. FIGS. 4E and 4F show reflectance as a function of wavelength measured by the spatial reflectometer and the fitted values of $In_2O_3$ (FIG. 4E) and $MoO_3$ (FIG. 4F) films.

FIGS. 5A and 5B show the In 3d (FIG. 5A) and O 1 s is (FIG. 5B) of single 288 nm $In_2O_3$ films on quartz substrate (A: $In_2O_3$, B: $In_2O_3$, C: In—OH (surface or bulk), or oxygen ion around oxygen vacancy region). FIGS. 5C and 5D show Mo 3d (FIG. 5C) and O 1 is (FIG. 5D) of single 408 nm $MoO_3$ films on quartz substrate (D: $MoO_3$, E: Mo—OH (surface or bulk), or oxygen ion around the oxygen vacancy region, F: $H_2O$ (surface)).

FIG. 8A shows X-ray diffraction patterns of $In_2O_3$ (upper trace), $MoO_3$ (lower trace) and a multilayer film (middle trace) of 40% $In_2O_3$ concentration with a 7 nm/15 nm ($In_2O_3$/$MoO_3$). The broad peak around 22 degrees is from the quartz substrate. FIG. 8B shows X-ray diffraction patterns of multilayers of 40% $In_2O_3$ concentration with various $In_2O_3$ thicknesses in order from 28 nm (top trace) to 4 nm (bottom trace). The broad peak around 22 degrees is from the quartz substrate.

FIG. 8C shows X-ray reflectivity spectra of multilayers of 40% $In_2O_3$ concentration with various $In_2O_3$ thicknesses in order from 14 nm (top trace) to 4 nm (bottom trace). FIG. 8D shows X-ray reflectivity spectra for a multilayer film of 40% $In_2O_3$ concentration with a 7 nm/15 nm ($In_2O_3$/$MoO_3$).

FIGS. 9A-9C shows scanning transmission electron microscope images. FIG. 9A shows a scanning transmission electron microscope image of 16 layers of 5-nm-thick $In_2O_3$ and 8-nm-thick $MoO_3$. FIG. 9B shows a high-resolution transmission electron microscope image of 16 layers of 5-nm-thick $In_2O_3$ and 8-nm-thick $MoO_3$ near the top of the superlattice. FIG. 9C shows a high-resolution transmission electron microscope image of 16 layers of 5-nm-thick $In_2O_3$ and 8-nm-thick $MoO_3$ near the bottom of the superlattice.

FIGS. 10A-10B show the physical structure of the multilayer films. FIG. 10A shows the cross-sectional scanning transmission electron microscopy image of a 16 bilayer 7 nm $In_2O_3$ and 15 nm $MoO_3$ stack on a quartz substrate. The Pt capping layer is adopted to protect the sample. The inset in FIG. 10A shows the SADP of the whole layer of the equivalent sample. FIG. 10B shows bright field high-resolution transmission electron microscopy images of the same sample; the image to the right is for a 16 bilayer 7 nm $In_2O_3$-0.5 nm $MoO_3$ sample and the image to the left is for a 7 nm $In_2O_3$-15 nm $MoO_3$ sample.

FIG. 11A shows electrical mobility of $In_2O_3$—$MoO_3$ multilayers as a function of $In_2O_3$ thickness. FIG. 11B shows carrier concentration of $In_2O_3$—$MoO_3$ multilayers as a function of $In_2O_3$ thickness. FIG. 11C shows electrical resistivity $In_2O_3$—$MoO_3$ multilayers as a function of $In_2O_3$ thickness. Electrical properties of pure $In_2O_3$ single layer and pure $MoO_3$ single layer deposited at 200° C. were included in each graph for comparison.

FIG. 12A shows Hall mobility, FIG. 12B shows the electron carrier concentration, and FIG. 12C shows the resistivity of the multilayer films as a function of $MoO_3$ thickness. The electric properties of each single layer are plotted in the graphs with horizontal straight lines for reference.

FIG. 13A shows the elastic modulus of a sample comprising 24 bilayers of 8 nm $In_2O_3$-5 nm $MoO_3$ independently measured by different labs. FIG. 13B shows the elastic modulus of the 24 bilayer sample shown in FIG. 13A compared 350 nm $In_2O_3$ and 350 nm $MoO_3$ samples. FIG. 13C shows the hardness of a sample comprising 24 bilayers of 8 nm $In_2O_3$-5 nm $MoO_3$ independently measured by different labs. FIG. 13D shows the hardness of the 24 bilayer sample shown in FIG. 13C compared 350 nm $In_2O_3$ and 350 nm $MoO_3$ samples.

DETAILED DESCRIPTION

Figure 1:
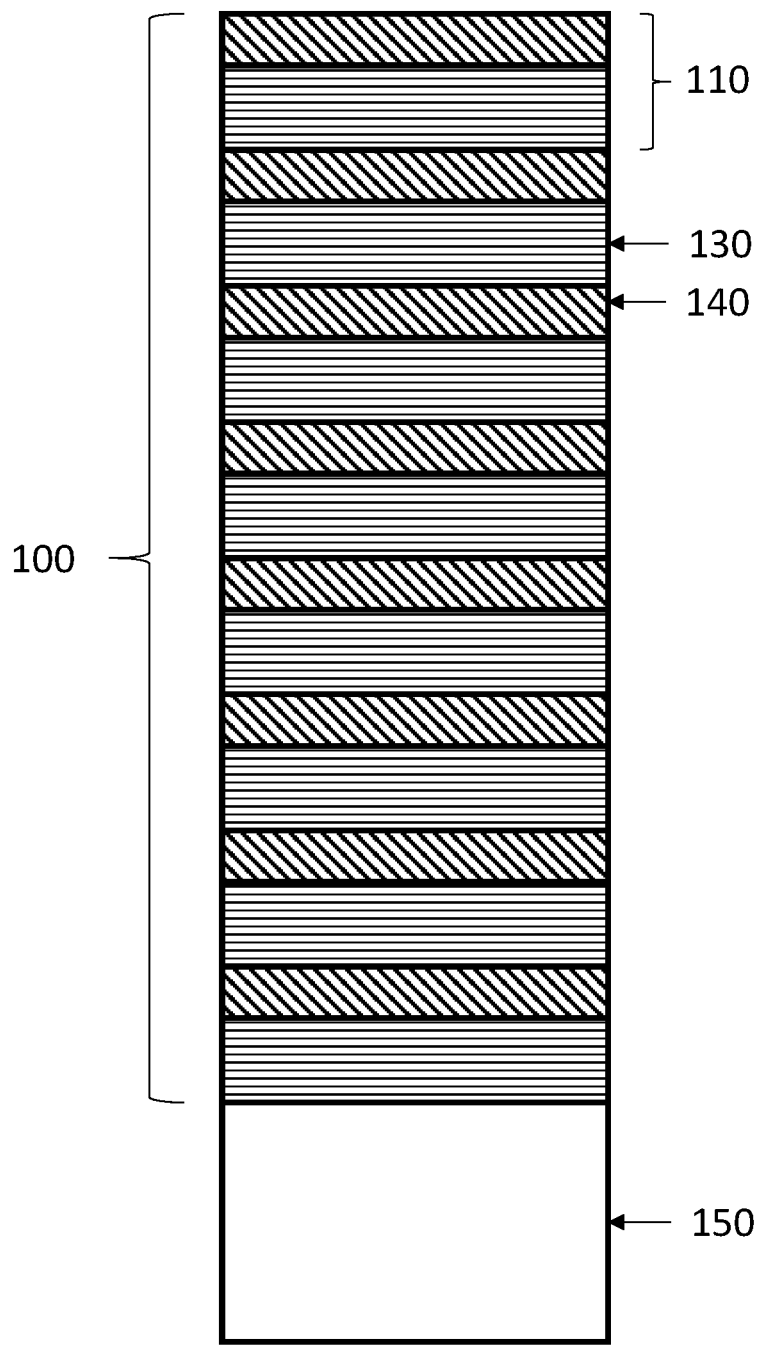
FIG. 1 shows an illustration of a superlattice.

Disclosed herein are superlattice thin film structures for use in photonic and electrical devices and methods for making the same. The superlattices described herein are prepared by matching the rates of deposition of two different materials. By using precision deposition techniques, such as pulsed laser deposition, sub-monolayers may be grown with sub-nanometer accuracy. To perform this fabrication process reproducibly with such small length scales, precise control of all the deposition conditions is necessary. By matching the rates of deposition of different materials under the same deposition conditions, superlattices may be prepared with precisely defined interfaces having sub-nanometer surface roughness by merely changing the material source. This allows for the formation of superlattices having nanometer thicknesses, resulting in superior electromechanical or photonic properties.

In some embodiments, the superlattices are polymorphic superlattices. Polymorphic superlattices greatly suppress cumulative defects with increasing stack thickness by sandwiching thin crystalline layers between amorphous layers. Crystals, by definition, have long-range order, whereas order persists for only a few atomic spacings in amorphous materials. By preparing polymorphic superlattices, long-range strain fields and propagating defects can be suppressed (intercepted) by the amorphous spacer materials. This approach greatly suppresses cumulative memory of defects as the number of building blocks or total stack thickness increases. Using this methodology, superlattices comprising layers of a crystalline semiconducting material and layers of amorphous insulating materials have been prepared. As demonstrated in the Examples, the electrical properties of these superlattices are superior to either of the materials used to prepare the superlattice.

One aspect of the invention is superlattices prepared from the materials and methods described herein. As shown further below, the methods allow for the preparation of superlattice films having higher electrical performance than either of the materials from which it is prepared. As used herein, a "superlattice" is a periodic structure of two or more materials. Typically, the superlattice has layer thickness in the periodic direction smaller than a direction orthogonal to the periodic direction. Suitably, the superlattice may have a layer thickness of a monolayer to hundreds of monolayers in the periodic direction, e.g., from about 0.1 nm to about 50.0 nm or 0.1 to about 10.0 nm, but a dimension of a micron or more in a direction orthogonal to the periodic direction.

Our design allows superlattices having improved elastic behavior and superior electrical or photonic properties. Without wishing to be bound to theory, it is believed that nano-laminates are capable of resulting in materials having superior strength and/or fewer dislocations than either of the bulk materials from which the nano-laminate is made. This may be accomplished by selecting the materials for favorable properties. For example, selecting materials having (i) lattice parameters that are substantially equal can minimize strain, (ii) thermal expansion coefficients that are substantially equal can minimize changes due to temperature that destroy the lattice fit at the interfaces, (iii) dissimilar elastic constants, i.e., energy per unit length, such that large external stresses are required to drive dislocations from the material having the lower line energy to the one with higher line energy, and (iv) strong bonding between the materials at the interfaces. Suitably, the materials may be selected to have any combination of these properties. Moreover, to prepare strong materials having minimized dislocations, it may be preferable to have low layer thicknesses of each material so that dislocation generation is minimized. Suitably the thickness of the layer may be on the order of 100 atomic layers thick or less, e.g., from 0.1 nm to 15.0 nm or 0.1 nm to 10.0 nm. Koehler, J. S., Phys Rev. B 2(2):547-551 (1970).

As demonstrated in the Examples, superlattices with spacings less than about 15.0 nm show superior electrical properties. Such superlattices have low loss. When one of the layers has a spacing much higher than 15.0 nm, the electrical properties in the plane deteriorates dramatically due to in-plane formation of dislocation loops. This in turn leads to very high resistivity, which is shown in the Examples. Suitably, the superlattices may be prepared such that neither of the materials has a thickness greater than 15.0 nm, 12.0 nm, 10.0 nm, or 8.0 nm.

The materials used to prepare the superlattice may be selected to have matching deposition rates under the same deposition conditions. This allows for the preparation of superlattices having sharp interfaces or low surface roughness. As demonstrated in the Examples that follow, the materials may be selected to preparing the layers of different materials under the same deposition conditions that each have RMS roughnesses less than 0.5 nm. Selecting materials having matching deposition rates allows for the preparation of materials having exceptional electrical or photonic properties.

Superlattices may be prepared to include one or more of the following attributes: improved hardness relative to any of the materials from which it is prepared, the ability to integrate a high density of devices on flexible substrates, the ability to couple light with electrons, and the ability to send broadband signals at very high speeds, but with low power consumption. The superlattice films described herein have high electrical performance and high optical dynamic response. In fact, our results show a mobility enhancement of a factor close to ten with our best superlattice film. The superlattices may be prepared on flexible substrates for alternative mechanical properties.

Superlattices

FIG. 1 illustrates a 2-D superlattice. The superlattice 100 comprises a set of alternating layers 110 of a first material 130 and a second material 140. Suitably, the superlattice may be disposed on a substrate 150. Each layer of material will have a typical thickness in range of an atomic monolayer to hundreds of monolayers, i.e., sub-nanometer to tens of nanometers. One or both materials may have a layer thickness greater than 0.1 nm, 0.5 nm, 1.0 nm, 1.5 nm, or 2.0 nm and less than 50.0 nm, 40.0 nm, 30.0 nm, 20.0 nm, 15.0 nm, 12.0 nm, 10.0 nm, or 8.0 nm, including any range therebetween. Suitably each layer of the materials will have a layer thickness between 0.1 nm and 20.0 nm, 0.1 nm and 15.0 nm, 0.1 nm and 12.0 nm, 0.1 nm and 10.0 nm, 0.1 nm and 8.0 nm, 0.5 nm and 20.0 nm, 0.5 nm and 15.0 nm, 0.5 nm and 12.0 nm, 0.5 nm and 10.0 nm, 0.5 nm and 8.0, 1.0 nm and 12.0 nm, 1.0 nm and 15.0 nm, 1.0 nm and 12.0 nm, 1.0 nm and 10.0 nm, or 1.0 nm and 8.0 nm.

The total superlattice thickness will typically be greater than 100 nm or 200 nm in the periodic direction. Suitably the total superlattice thickness will be between 100 to 500 nm or 200 nm to 400 nm.

The superlattice will have at least two alternating layers. Suitably the superlattice will have at least 3, 4, 5, 6, 7, 8, 9, or 10 alternating layers. Suitably the superlattice may have between 2 and 40 alternating layers, 2 and 30 alternating layers, or 2 and 20 alternating layers.

The superlattice may suitably have a width greater than about 500 nm. In some embodiments, the superlattice has a length of about 500 nm to about 5 microns or about 1 micron to 2 microns.

The superlattice may be prepared from a number of different materials. The first and second materials of the superlattice may be selected based on their morphological characteristic, their electromagnetic characteristic, or both.

In some embodiments, the % wt of the one of the materials in the superlattice is between about 10% and about 60%. This includes superlattices having a % wt of one of the materials between about 15% and about 60%, about 20% and about 60%, about 25% and about 60%, or about 30% and about 60%.

The roughness of a layer at and interface between the first and second material is preferably minimized. Suitably, the RMS roughness of a layer of material is less than 0.5 nm. Suitably, the RMS roughness of a layer of material may less than about 0.4. or 0.3 nm.

The first or second material may be selected between crystalline materials or amorphous materials. A crystalline material is a material having a highly ordered microscopic structure. An amorphous material lacks an ordered microscopic structure. In some embodiments, the superlattice may be prepared from a first and a second material that have the same morphological characteristic, e.g., both the first and the second material are crystalline or both the first and second material are amorphous. In other embodiments, the superlattice may be prepared from a first or second material that have different morphological characteristics, e.g., the first may be crystalline and the second material may be amorphous.

The first or second material may be selected from semiconductive materials, metallic materials, superconductive materials, magnetic materials, or insulating materials. A metallic material is a material having its Fermi level within an electronic band populated with holes or electrons. A semiconductive material is a material having its Fermi level between two electronic bands but the bands are close enough to the Fermi level for both bands to be populated with electrons or holes. An insulating material is a material having its Fermi level between two electronic bands but the higher energy band is not thermally populated with electrons or holes. A superconductive material is a material having zero resistivity below a critical temperature. A magnetic material is a material capable of having a net magnetic moment in the absence of an external magnetic field. In some embodiments, the superlattice may be prepared from a first and a second material that have the same electromagnetic characteristic, e.g., both the first and the second material are both semiconductive, metallic, superconductive, magnetic, or insulating. In other embodiments, the superlattice may be prepared from a first or second material that have different electromagnetic characteristics. For example, one material is semiconductive and the other material is metallic, superconductive, magnetic, or insulating; one material is metallic and the other material is semiconductive, superconductive, magnetic, or insulating; one material is superconductive and the other material is semiconductive, metallic, magnetic, or insulating; one material is magnetic and the other is semiconductive, metallic, superconductive, or insulating; or one material is insulating and the other is semiconductive, metallic, superconductive, or magnetic. Suitably, the first may be semiconductive and the second material may be insulating.

In some embodiments, the superlattice may be prepared from a first and a second material that have the same morphological and electromagnetic characteristic, e.g., the first and second material may be crystalline semiconducting materials. In other embodiments, the superlattice may be prepared from a first or second material that have different morphological and electromagnetic characteristics, e.g., the superlattice may be comprised of layers of crystalline transparent semiconducting (CTS) material separated by layers of an amorphous transparent insulating (ATI) material as exemplified in the Examples.

The superlattice structure as shown in the Examples consists of alternating semiconducting and amorphous-insulating layers grown on a substrate. These basic units can then be stacked one above the other through multiple layers, as seen in FIG. 1. If the insulating layers are sufficiently thin, tunneling between the semiconducting layers may be present, leading to charge transport in the vertical direction. For thicker insulating layers charge transport will be largely lateral, being confined to the semiconducting layers due to reflection from the adjacent insulating layers. Other electrical or photonic superlattices may be prepared by the selection of materials.

Methods of Making Superlattices

Another aspect of the invention is methods for making superlattices. Superlattice films may be grown in well-controlled ultra-thin (with sub-monolayer accuracy) layers using a deposition technique that allows for the epitaxial growth of the superlattice, such as pulsed laser deposition. By selecting materials having matching deposition rates, precise control of the growth of the superlattice is accomplished and the roughness of the layers of material at the interface may be minimized.

Superlattice fabrication may employ pulsed laser deposition (PLD). This approach allows for fabrication of superlattice structures with layer thicknesses controlled to sub-monolayer precision. The deposition conditions may be tuned, allowing sequential deposition of alternating layers of the first and second material where the only variable in the whole process is the switching between targets comprising the first and second material. Precision manufacturing is enhanced when the ratio of rate of deposition between the two materials are similar.

Figure 2:
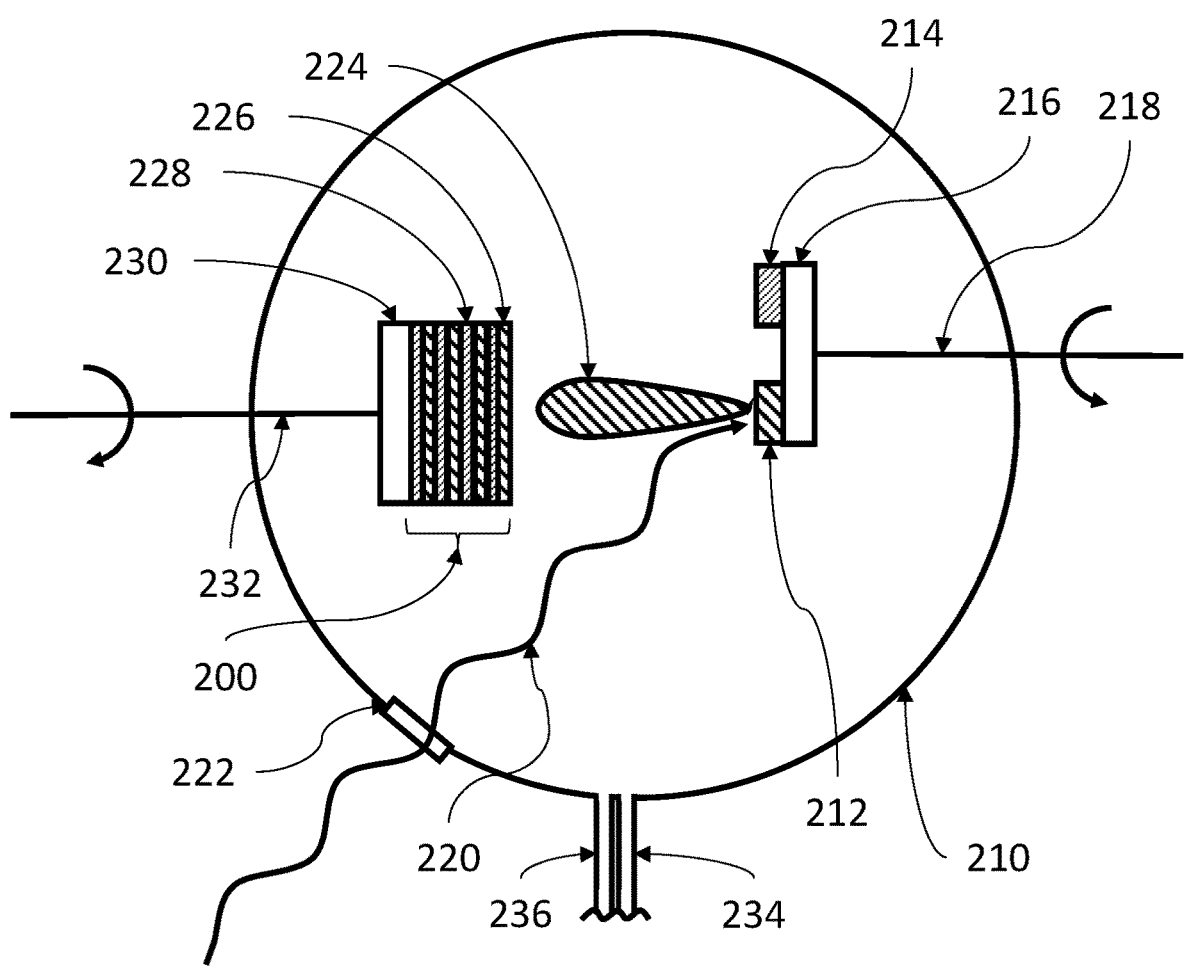
FIG. 2 shows a schematic of a pulsed laser deposition (PLD) system.

FIG. 2 schematically illustrates the preparation of superlattices by pulsed laser deposition. Within a vacuum chamber 210 a superlattice 200 is grown by alternating epitaxial deposition of a first material 212 and a second material 214. The first material 212 and second material 214 may be any of the materials for preparing the superlattices described herein. The first material 212 and second material 214 may be held on a movable stage 216. The movable stage 216 may be used to position the first material 212 and the second material 214 into a zone of irradiation via a rotatable arm 218, allowing for the materials to be irradiated by electromagnetic radiation 220 such as an high energy laser. The irradiating electromagnetic radiation 220 may enter the chamber 210 via an optical window 222. The deposition system may optionally include light directing or focusing lenses and mirrors, which are not shown. Upon irradiation by the electromagnetic radiation 220 of the first material 212 in the zone of irradiation, a plume of the first material 224 is ejected. The material of the plume 224 may be deposed as an epitaxial layer on the superlattice 200. The movable stage 216 may be used to subsequently position the second material 214 into the zone of irradiation where the second material 214 may be irradiated by the electromagnetic radiation 220. By repeating this process, the superlattice 200 may be grown having layers of the first material 226 and the second material 228. The superlattice 200 may be grown on a substrate 230 having an arm 232 attached thereto. The arm 232 may be rotatable to improve distribution of material being deposited. The vacuum chamber 210 may also have vacuum line 234 attached to a pump for lowering the pressure within the chamber and/or an inlet 236 for controlling the pressure and gaseous composition within the chamber.

Figure 3:
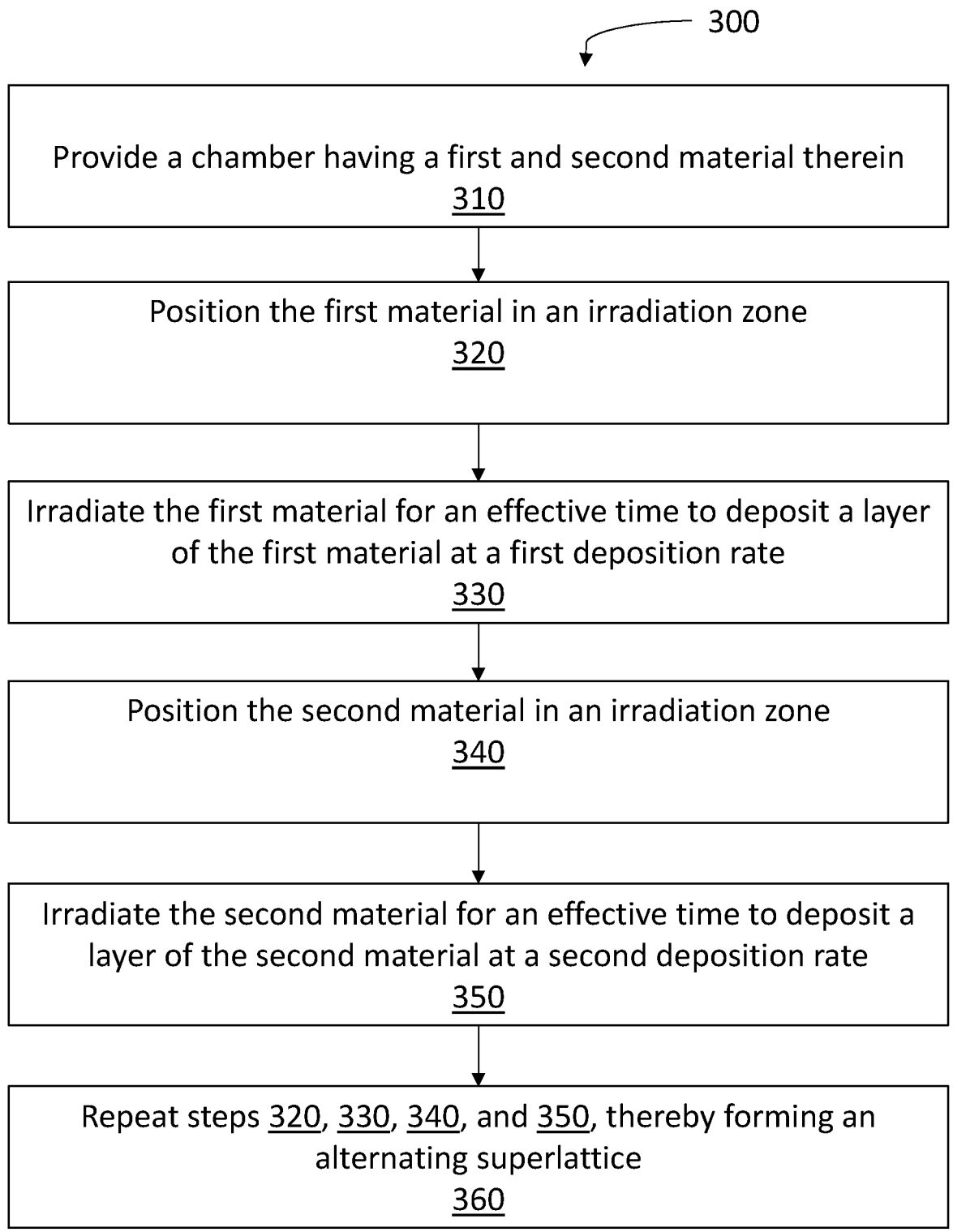
FIG. 3 shows a block-flow diagram of a method for preparing a superlattice.
Figure 4A:
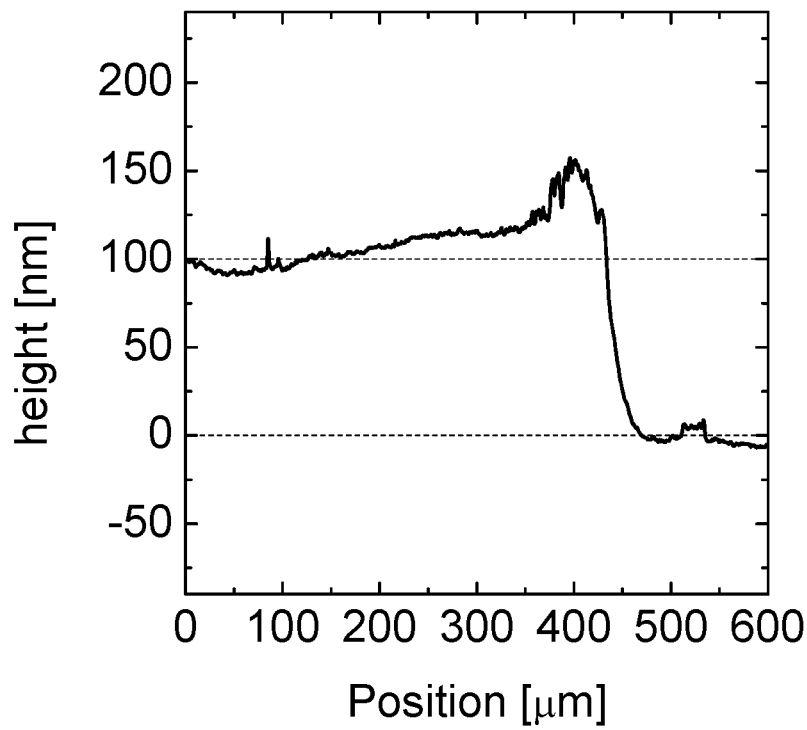
FIGS. 4A-4F show thickness measurements of 100-nm-targeted $In_2O_3$ and $MoO_3$ films on quartz substrates.
Figure 4B:
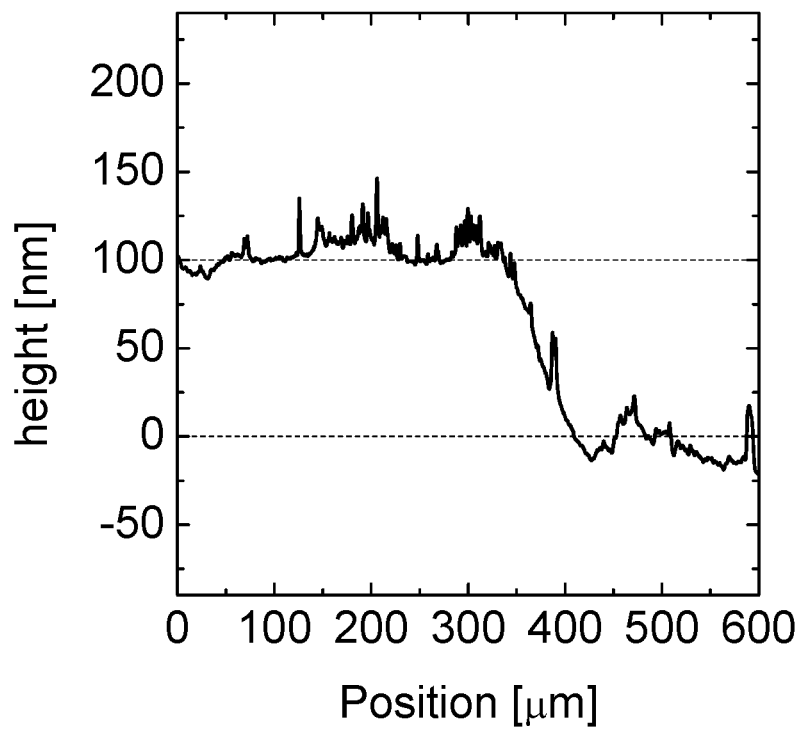
Figure 4C:
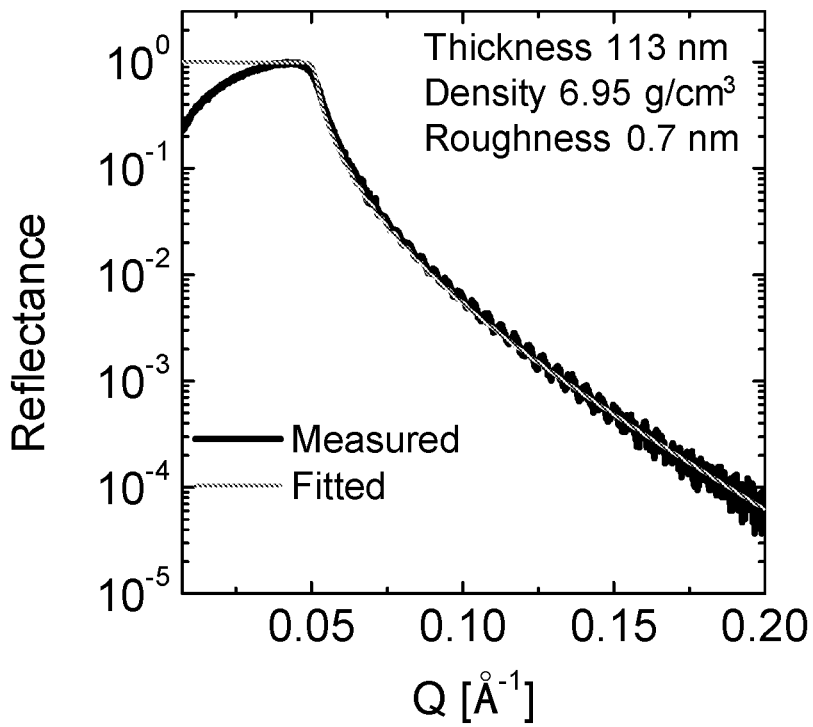
Figure 4D:
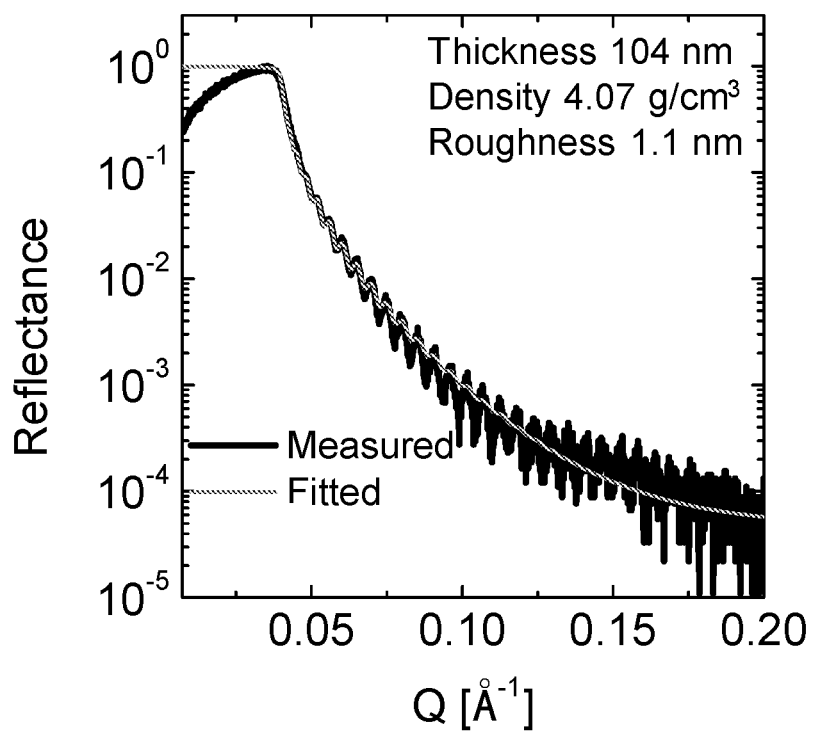
Figure 4E:
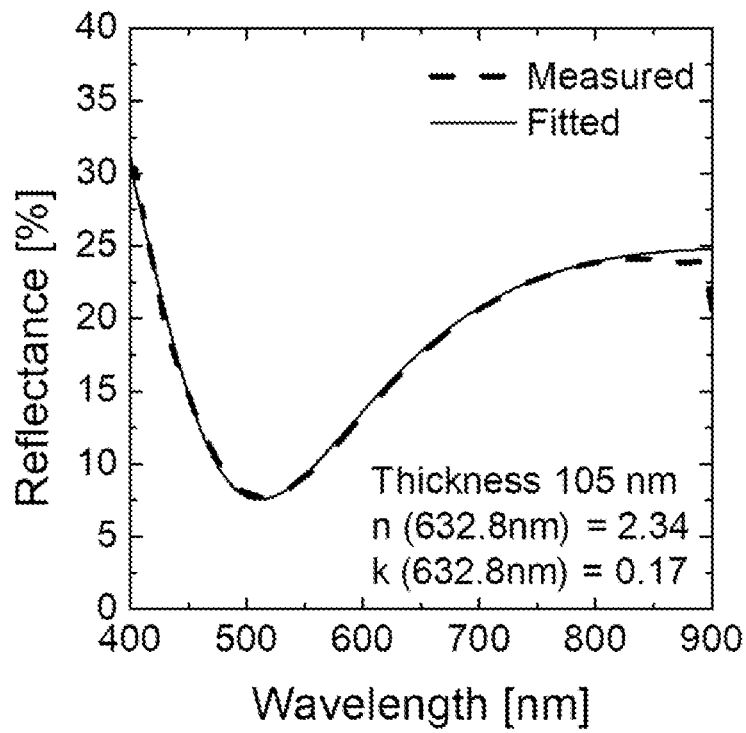
Figure 4F:
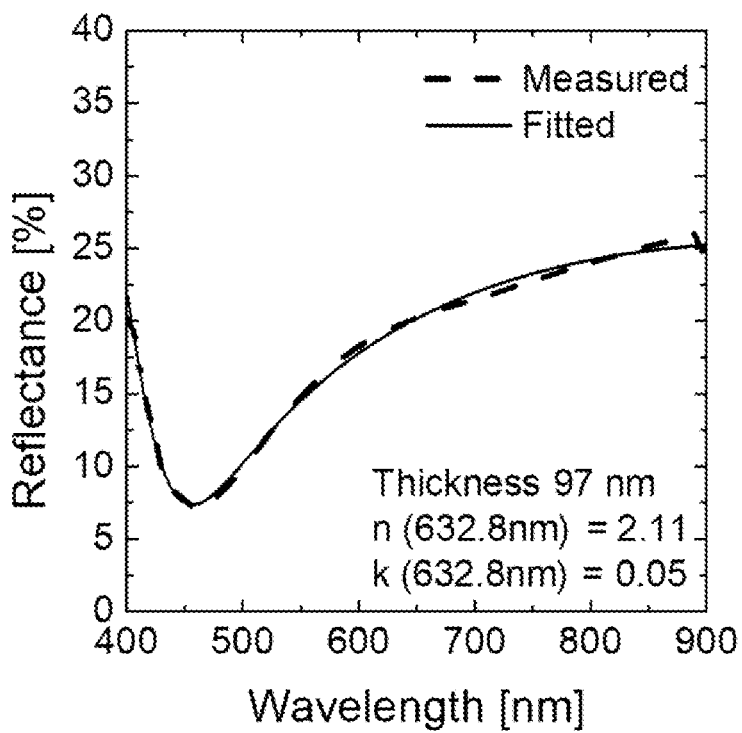
Figure 5A:
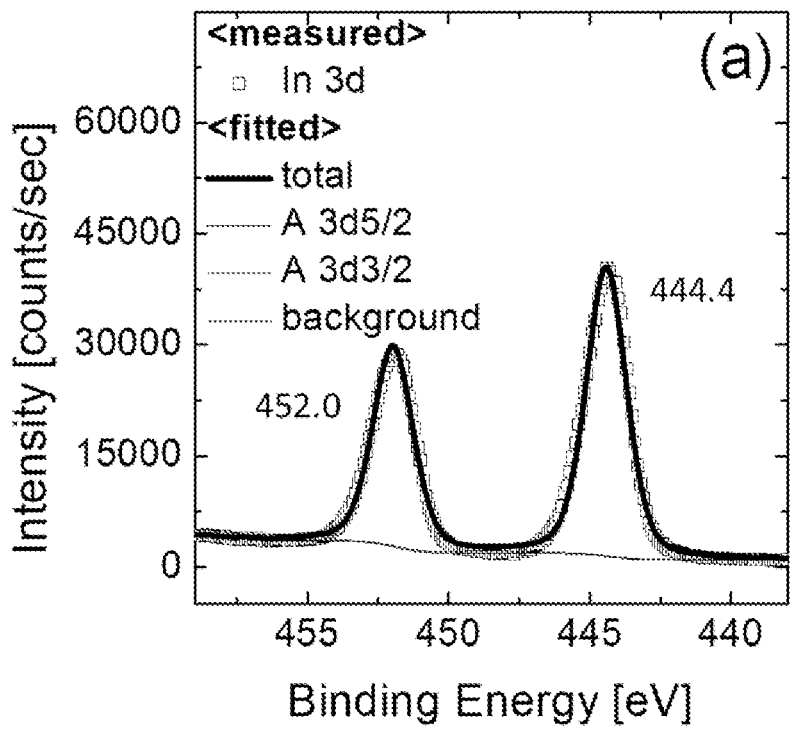
FIGS. 5A-5D show XPS spectra of single layer films.
Figure 5B:
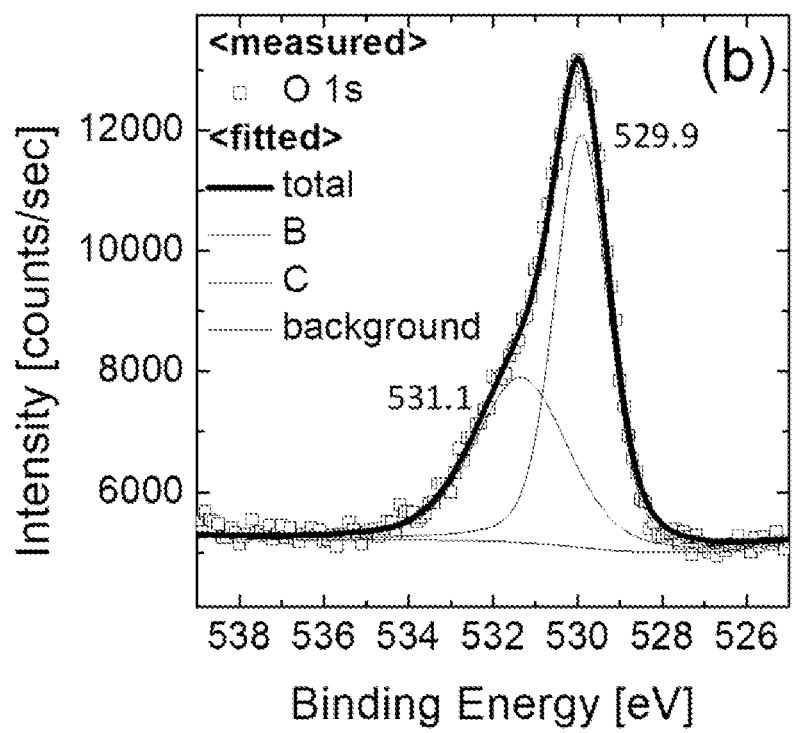
Figure 5C:
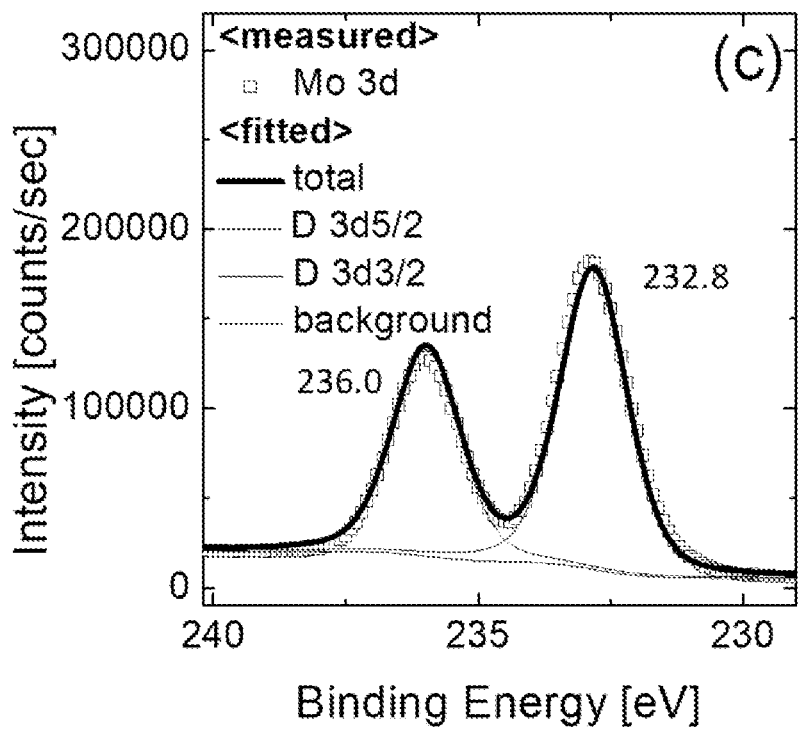
Figure 5D:
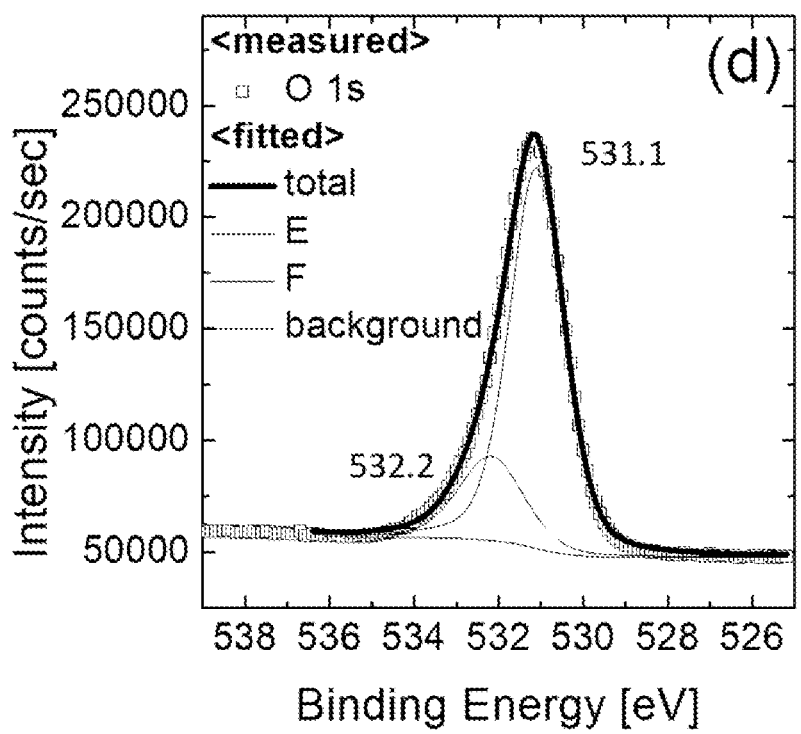

FIG. 3 illustrates the method of preparing a superlattice 300 represented as a flow chart. The method comprises providing a chamber as described above having a first a second material therein 310. The first material is positioned in an irradiation zone 320, and the first material is irradiated for an effective time to deposit a layer of the first material at a first deposition rate 330. The second material is positioned in the irradiation zone 340, and the second material is irradiation for an effective time to deposit a layer of the second material at a second deposition rate 350. Steps 320, 330, 340, and 350 may be repeated any number of suitable times, thereby preparing the superlattice 360.

As used herein, an effective time is the amount of time necessary to prepare a layer of desired thickness. The effective time is determined by the desired layer thickness and deposition rate of the material. When the superlattice is prepared by PLD, the deposition rate may be determined by the amount of material deposited per laser pulse. For example, the deposition rate of $In_2O_3$ and $MoO_3$ are 0.023 nm/pulse and 0.033 nm/pulse, respectively.

In order to prepare high quality superlattices, the deposition rate of the first and second material should be matched at substantially constant deposition conditions. Suitably, the ratio of the deposition rates of the first and second material is between 1.0:2.0 and 2.0:1.0, 1.1:2.0 and 2.0:1.1, 1.2:2.0 and 2.0:1.2, 1.4:2.0 and 2.0:1.4, or 1.5:2.0 and 2.0:1.5. For example, the ratio of the deposition rates of $In_2O_3$ and $MoO_3$ is approximately 1.4:2.0.

Several deposition conditions may be varied depending of the materials to be deposition. Examples of deposition conditions include, without limitation, the pressure within the chamber, the gaseous composition within the chamber, the temperature within the chamber, the temperature of the stage, the temperature of the substrate, the wavelength of the electromagnetic radiation, the bandwidth of the electromagnetic radiation, the power of the electromagnetic radiation, the frequency of the electromagnetic radiation pulses, or any combination thereof. A challenge in depositing superlattice with alternating layers is to identify compatible processing conditions. For the crystalline transparent semiconducting (CTS) layers and amorphous transparent insulating (ATI) layers described below, the superlattices was prepared with a background pressure of 15 mTorr oxygen at a temperature between 50° C. to 250° C., preferably 200° C., with an averaged deposition rate of about 0.03 nm/sec with a 248 nm KrF excimer pulsed laser deposition system equipped with multi-material rotating targets. Using these conditions, superlattice thin films of different concentrations of CTS for a fixed total film thickness of ~200-400 nm were prepared. Once the PLD system is calibrated, the only thing that needs to be changed is the positioning of the materials within the zone of irradiation. This allows for the precise control of the fabrication of the superlattices.

Crystalline-Amorphous Superlattices

In some embodiments, the superlattices comprise nanometer-thick alternating crystalline and amorphous layers. Across the superlattice layers, the alternating amorphous layers help to suppress the propagation of defects. The Examples demonstrate that the resulting structure has low electrical resistance across the whole structure as well as superior hardness and elastic properties. These superlattices may also be used to fabricate photonic devices, including, but not limited to, field-effect transistors, plasmonic junction photo detectors, and multifunction integrated photonic devices.

Due to its well-understood properties and wide usage in industry, transparent conducting oxide (TCO), such as indium-tin-oxide (ITO), may be used as a plasmonic medium for light-matter interaction.

In some embodiments, the crystalline transparent semiconducting material comprises a transparent conducting oxide, a transparent conducting nitride, a transparent conducting carbide, or a transparent conducting chalcogenite. In some embodiments, the crystalline transparent semiconducting material comprises a post-transition metal oxide or a transition metal oxide. In certain embodiments, the post-transition metal of the post-transition metal oxide is selected from the group consisting of Al, Zn, Ga, Ge, Cd, In, Sn, Sb, Hg, Tl, Pb, Bi, Po, and any combination thereof. In some embodiments, the crystalline transparent semiconducting material comprises $In_2O_3$. In some embodiments, the crystalline transparent semiconducting material comprises $SnO_2$. In some embodiments, the crystalline transparent semiconducting material comprises $In_2O_3:SnO_2$. In particular embodiments, the weight ratio of $In_2O_3$ to $SnO_2$ is about 99:1 to about 1:99. In some embodiments, the crystalline transparent semiconducting material comprises a transition metal dopant or a post-transition metal dopant. The materials may also be doped by post-deposition annealing in various atmospheres (e.g., dry or humid air) or with hydrogen, fluorine, or chlorine.

In some embodiments, the amorphous transparent insulating material comprises an insulating oxide. In certain embodiments, the amorphous transparent insulating material comprises $MoO_3$ or GaO. In some embodiments, the amorphous transparent insulating spacer is flexible.

In some embodiments, the % wt of the crystalline transparent semiconductor in the superlattice is between about 10% and about 60%. This includes superlattices having a CTS % wt between about 15% and about 60%, about 20% and about 60%, about 25% and about 60%, or about 30% and about 60%.

Transparent conducting oxides (TCOs) are materials that have greater than 80% transmittance of incident light as well as electrical conductivities higher than $10^3$ S/cm for efficient carrier transport. TCOs typically have a minimum carrier concentration on the order of $10^{20}$ $cm^{-3}$ for low resistivity and a bandgap greater than 3.2 eV to avoid absorption of light over most of the solar spectra. A TCO must necessarily represent a compromise between electrical conductivity and optical transmittance, a careful balance between the properties is required. Reduction of the resistivity involves an increase either in the carrier concentration or in the mobility. Increasing the former also leads to an increase in the visible absorption. Increasing the mobility, however, has no deleterious effect. Achieving a high-carrier mobility will necessarily improve the optical properties. Materials suitable for use with the present technology include those described in Boltasseva and Atwater Science (2011) 331:290-291.

Crystalline ITO is a well-known high performance (TCO) compared to other TCOs. It is a degenerate semiconductor with a carrier concentration in the range of $10^{20}$ to $10^{21}$ per $cm^3$, a band gap of about 3.3 eV, mobility in the range of 10 to 100 $cm^2V^{-1}s^{-1}$, and conductivity about $10^4$S/cm. The plasma frequency of ITO is between about 1.3-1.8 eV, and at around 1.5 µm the real part of the material permittivity starts to go negative (or plasmonic in nature). Using post annealing processing, the ITO plasma frequency can be varied in a controlled manner. By introducing compositional defects or perfecting the crystallinity of the ITO, it is possible to vary the mobility of charge carriers in the material. The control of plasmon parameters allows for the rational design of plasmonic related devices in the near-IR to mid-IR range. It has been shown that the imaginary part of the dielectric function is about a factor of four smaller than that of silver in the IR region. Thus, it is clear that with the large losses in metals, TCO materials are better alternate choices for IR plasmonic research and applications.

The superlattice films may be patterned into an array of "antennas" for IR light harvesting and integrating them with IR photo diodes to convert photons into electrons for sensing. The photocurrents are generated because of excitation of resonant plasmon modes determined by the nano-rod geometries. The decay of these plasmons generates energetic electrons at the plasmon electrode-semiconductor diode junction. The "hot electrons" can then travel across the semiconductor detector and those charges that make it across to the opposite end will be collected as detected current. This approach has been practiced and reported in recent years using Au and Ag as nano-antenna arrays and integrated with many types of semiconductors including Si, $TiO_2$, and 2-D materials such as $MoS_2$. However, noble metals have large kinetic losses. Thus, the superlattices described herein are low loss TCO-IR plasmon active materials. PDL or lithography may be used to pattern the plasmon active junction IR photo detectors. The geometry may be varied to change the associated electrical parameters, in particular the Schottky barrier height, and the photocurrent. Polarized light with its electrical field oscillating along the length of the nanorods will induce strong wave coupling when the rod spacing is close. On the other hand when the electric field is normal the lengths of the rods, only the single rod effect is present The superlattice films may be used to prepare a number of photonic and/or electronic devices. For example, superlattice thin film structures may be applied to field effect transistors, high-speed modulation of IR signals, and the coupling of photons with electrons in junction configurations. For example, field effect transistors may be prepared from the superlattice layer as the active transparent oxide semiconductor (TOS) in the FET. The unique features of this layer include high mobility (~40-80 $cm^2$/V-sec), and improved electrical properties.

Miscellaneous

Unless otherwise specified or indicated by context, the terms "a", "an", and "the" mean "one or more." For example, "a molecule" should be interpreted to mean "one or more molecules."

As used herein, "about", "approximately," "substantially," and "significantly" will be understood by persons of ordinary skill in the art and will vary to some extent on the context in which they are used. If there are uses of the term which are not clear to persons of ordinary skill in the art given the context in which it is used, "about" and "approximately" will mean plus or minus ≤10% of the particular term and "substantially" and "significantly" will mean plus or minus >10% of the particular term.

As used herein, the terms "include" and "including" have the same meaning as the terms "comprise" and "comprising." The terms "comprise" and "comprising" should be interpreted as being "open" transitional terms that permit the inclusion of additional components further to those components recited in the claims. The terms "consist" and "consisting of" should be interpreted as being "closed" transitional terms that do not permit the inclusion additional components other than the components recited in the claims. The term "consisting essentially of" should be interpreted to be partially closed and allowing the inclusion only of additional components that do not fundamentally alter the nature of the claimed subject matter.

All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

All references, including publications, patent applications, and patents, cited herein are hereby incorporated by reference to the same extent as if each reference were individually and specifically indicated to be incorporated by reference and were set forth in its entirety herein.

Preferred aspects of this invention are described herein, including the best mode known to the inventors for carrying out the invention. Variations of those preferred aspects may become apparent to those of ordinary skill in the art upon reading the foregoing description. The inventors expect a person having ordinary skill in the art to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

EXAMPLES

Example 1: Thin Film Growth by Pulsed Laser Deposition

Oxide thin films are deposited by PLD with a 248 nm KrF excimer laser. The laser pulse duration is 25 ns and the pulse frequency is 2 Hz. Each pulse of 220 mJ is focused to 1 mm×3 mm area at the target which rotates at 5 rpm. $In_2O_3$ and $MoO_3$ thin films are deposited from hot-pressed $In_2O_3$ and $MoO_3$ targets (25 mm diameter), respectively. Fused quartz substrates are mounted to the substrate holder with silver paste. The distance between the target and substrate is fixed to 10 cm. The chamber is pumped out before each deposition by the turbomolecular pump until the pressure reaches under $5\times10^{-7}$ Torr. The flow of high purity $O_2$ to the chamber is precisely controlled during deposition to obtain target oxygen pressure and the temperature of the substrate is controlled by the electric resistive heating substrate holder. The deposition pressure and temperature are 15 mtorr and 200° C., respectively, when they are not described exceptionally. FIG. 1 shows the schematic diagram of the PLD system.

Table 1 describes a series of superlattices composed of $In_2O_3$ and $MoO_3$ layers prepared by pulsed laser deposition as described herein.

TABLE 1

| $In_2O_3$ and $MoO_3$ superlattices | | | |
|---|---|---|---|
| Sample | Cy | $In_2O_3$ (nm) | $MoO_3$ (nm) |
| #1 | 32 | 4 | 8 |
| #2 | 16 | 7 | 15 |
| #3 | 8 | 14 | 30 |
| #4 | 4 | 28 | 60 |
| #5 | 2 | 56 | 120 |
| #6 | 38 | 7 | 1 |
| #7 | 32 | 7 | 3 |
| #8 | 24 | 7 | 7 |
| #9 | 8 | 7 | 40 |

Example 2: Sample Characterization

Thin films were characterized using transmission electron microscopy (TEM, JEOL, JEM-2100F/JEM-ARM 300F) to investigate the cross-sectional observation including the thickness, the crystal structure of each layer, and the interface property. TEM samples were prepared using a standard lift-out technique employing a dual-beam focused ion beam (FIB, FEI, Helios Nanolab 600 dual-beam) microscope with final $Ga^+$ energy of 2 kV at 24 pA. The selected area diffraction patterns (SADPs) were indexed using commercial software program, CrystalMaker. The surface morphology and cross-section images of oxide films were analyzed by field emission scanning electron microscopy (FESEM, Hitachi, SU8030). The surface morphology and the root-mean-squared roughness were obtained by atomic force microscopy (AFM, Bruker, Dimension FastScan). The thickness of the films was measured by spectral reflectometer (Filmetrics F20) and reconfirmed by stylus profilometer (Veeco, Dektak 150) and X-ray reflectivity (XRR). The crystal structure of the film was analyzed by X-ray diffraction (XRD) and thickness, density, and roughness were investigated by XRR using Cu Kα x-ray source (Rigaku, Smartlab). Two bounce of Ge (220) were employed as incident beam monochromator for high-resolution XRR. The film composition and chemical binding state were analyzed by X-ray photoelectron spectroscopy (XPS, Thermo Scientific ESCALAB 250Xi) without any surface cleaning. The flood gun was adopted during XPS analyses to maintain charge neutrality. Carrier density, mobility, and resistivity of the oxide films at room temperature were obtained via the Van der Pauw method by Hall effect measurement system (Ecopia, HMS-3000). Magnetoconductance and Hall effect measurement at low temperature (3.5-112 K) and high magnetic field (0-16 T) were conducted inside the Cryogenics Ltd. He-flow cryostat with closed-cycle helium superconducting magnet.

Example 3: Thickness Measurement of a Single Layer of $In_2O_3$ or $MoO_3$

Single layers off 100 nm $In_2O_3$ on quartz substrate and 100 nm $MoO_3$ on quartz substrate were fabricated by PLD. Thicknesses of the layers were measured by stylus profilometer, XRR, and spectral reflectometer. The measured thickness of each of the $In_2O_3$ and $MoO_3$ layers is in good agreement regardless to the analysis tool as shown in FIG. 4A-4F.

Example 4: Chemical States of the Single Layer of $In_2O_3$ and $MoO_3$

XPS analyses were carried out to determine the chemical state of the materials in the CAML. The XPS results of $In_2O_3$ single layer and $MoO_3$ single layer show that the deposited films principally follow the equivalent oxidation states of the $In_2O_3$ and $MoO_3$ targets. The $MoO_3$ films have a non-negligible amount of oxygen vacancies in the film. The peak deconvolution and each peak information are shown in FIG. 5A-5D. While the lattice oxygen peak (FIG. 5B) is dominant in $In_2O_3$ films, the regular lattice oxygen peak was not shown but the peak of oxygen ion around the oxygen vacancy was dominant in $MoO_3$ films. The results imply that the deposited films principally followed the equivalent oxidation states of the $In_2O_3$ and $MoO_3$ targets, even if the $MoO_3$ films had a non-negligible amount of oxygen vacancies.

Example 5: Preferred Orientation of the $In_2O_3$ Layer

Figure 6:
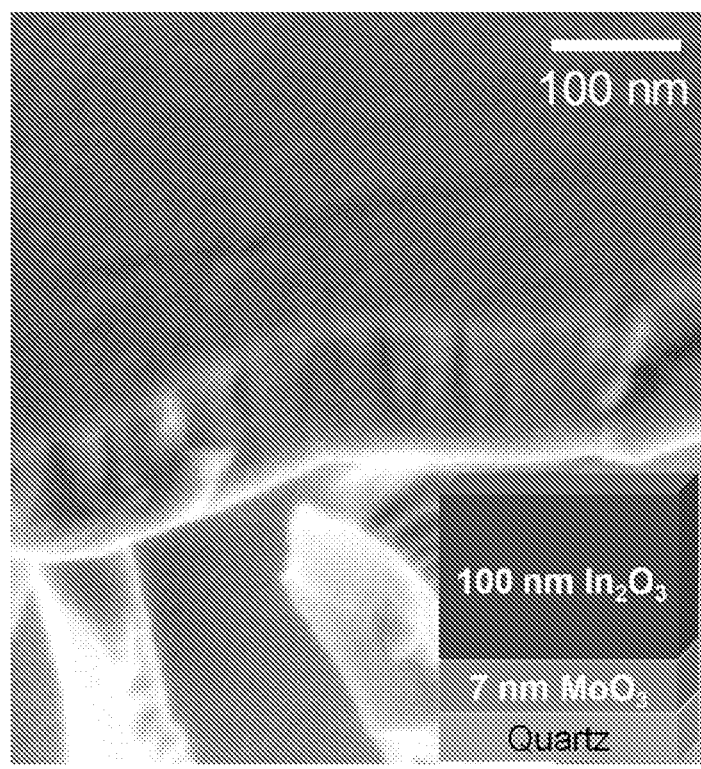
FIG. 6 shows columnar growth of $In_2O_3$ films with a bird-eye view SEM image of 100 nm $In_2O_3$/7 nm $MoO_3$/ quartz substrate.

It was noticed that the $In_2O_3$ layer has a preferred orientation as measured by electron beam diffraction. Because the layer is so thin, it is difficult to study the structure and observe what is causing the preferred orientation. To perform a more careful investigation, we used the same deposition condition but this time we grew a much thicker $In_2O_3$ layer. A 100 nm thick $In_2O_3$ layer was grown on 7 nm $MoO_3$/quartz substrate to examine the surface and cross-section morphology by SEM. The results are shown in the SEM image in FIG. 6 It is clear from the SEM image that the $In_2O_3$ grows in a continuous columnar mode (of ~30 nm in diameter). This result confirms the earlier observed preferred growth orientation.

Example 6: Effect of Deposition Temperature

X-ray diffraction measurements of $In_2O_3$ and $MoO_3$ as a function of deposition temperatures establish that a deposition temperature in the range of 200° C. to 250 C allows for layers of $In_2O_3$ with high crystallinity while maintaining $MoO_3$ amorphous morphology.

Figure 7:
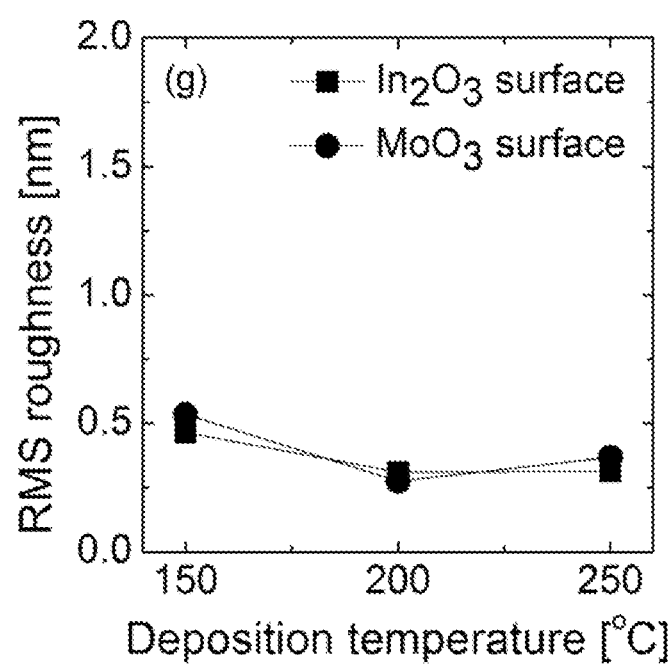
FIG. 7 shows the surface morphology of $In_2O_3$ and $MoO_3$ layers as a function of RMS roughness versus temperature obtained from AFM.

AFM measurements provide an indication of the film surface roughness as a function of temperature. RMS roughness measurement of the top 7 nm $In_2O_3$ layer of Sample #2 deposited at 150° C., 200° C., and 250° C., respectively, results an RMS roughness of less than 0.5 nm at all temperatures (FIG. 7). The AFM topographic images the top layer of 15 nm $MoO_3$ of Sample #2 grown at 150° C., 200° C., and 250° C., respectively, shows a minimum roughness around 200° C. (FIG. 7). These results, along with the X-ray diffraction measurements, shows our choice of 200° C. is a near optimal deposition temperature for superlattice preparation with $In_2O_3$ and $MoO_3$.

Example 7: X-ray Diffraction Measurements of Superlattice Films

Figure 8A:
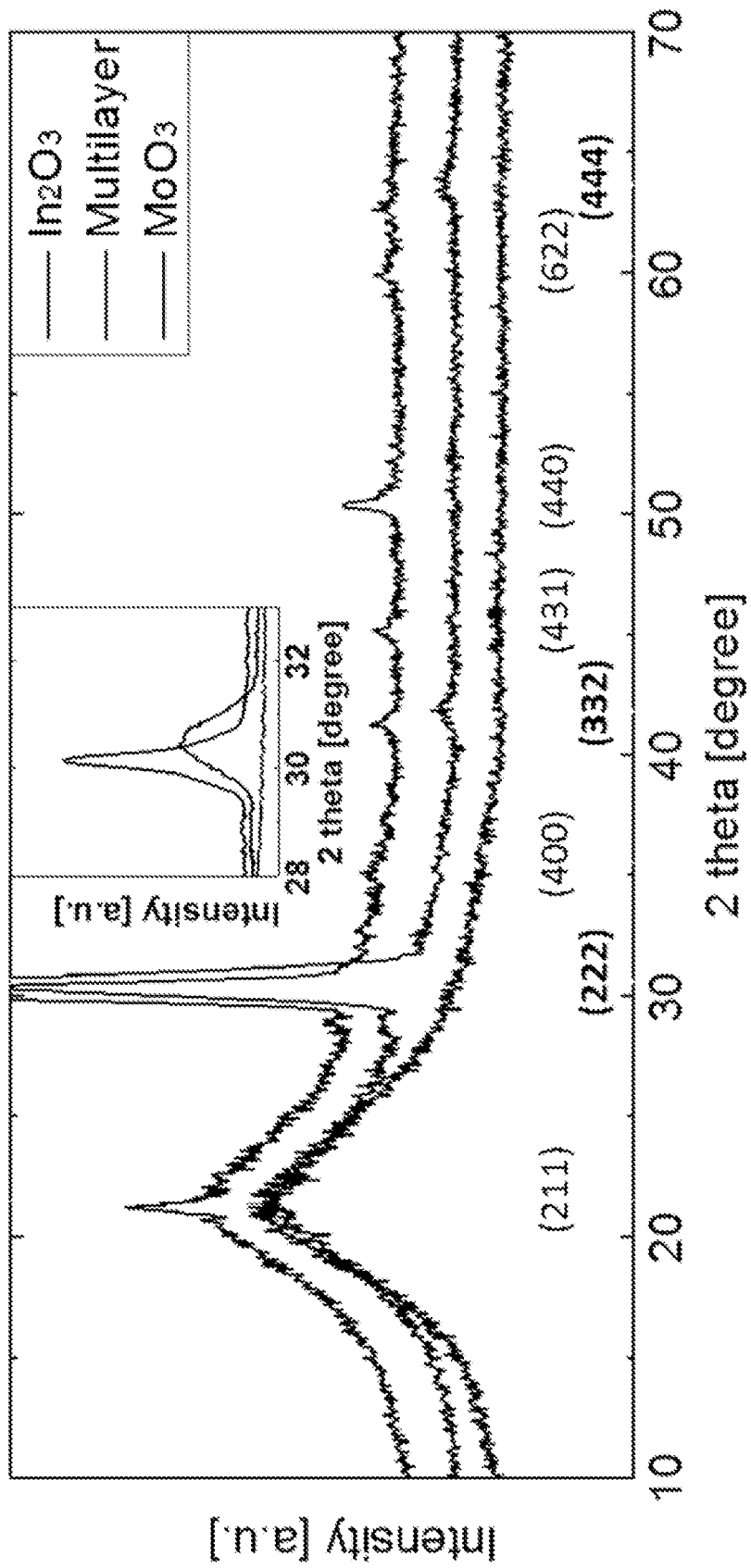
FIGS. 8A-8B show X-ray diffraction plots.
Figure 8B:
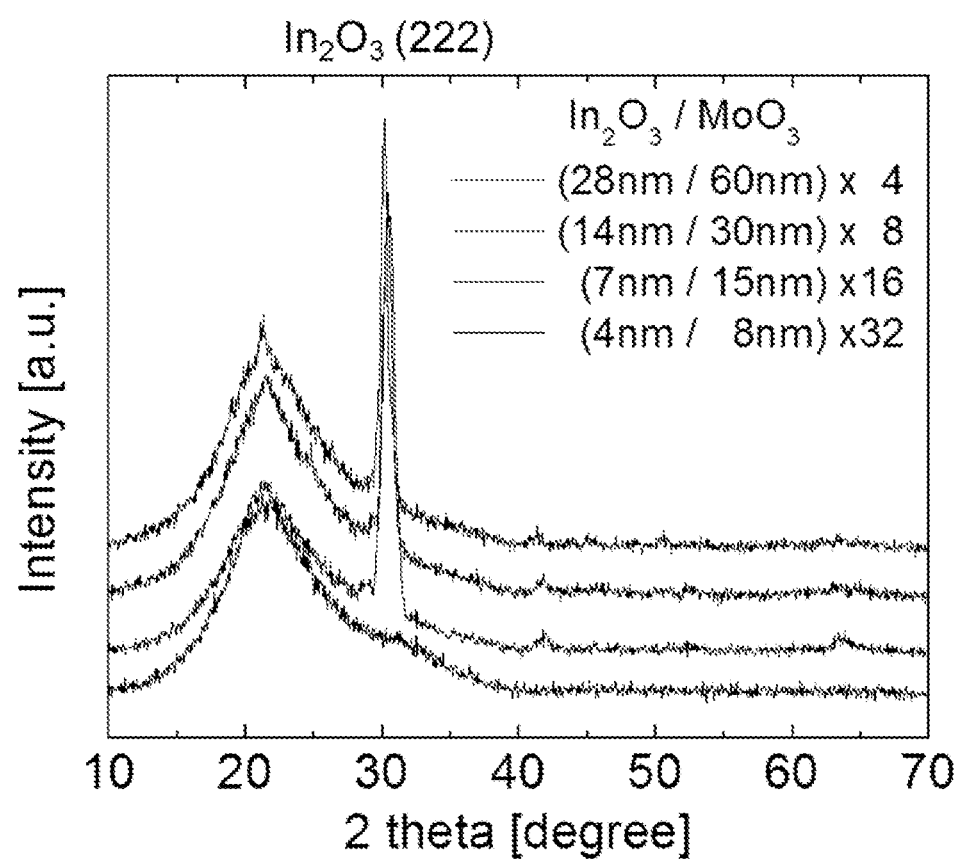

FIGS. 8A and 8B show an X-ray diffraction plots for various prepared superlattice films. From FIG. 8A we observe a crystalline peak at (222), associated with $In_2O_3$, which has a FWHM of 0.5 degree. FIG. 8B also shows how the preparation of the 7 nm/15 nm ($In_2O_3$/$MoO_3$) (Sample #2) multilayer film leads to a shifting of the center peak to a higher 2 theta angle and a widening of the FWHM. For the thinnest of the multilayer files, the signal is smeared out (FIG. 8B), possibly due to randomly oriented layers difficult for the X-ray to resolve from the superlattice stack.

Example 8: X-ray Reflectance Measurements of Superlattice Films

Figure 8C:
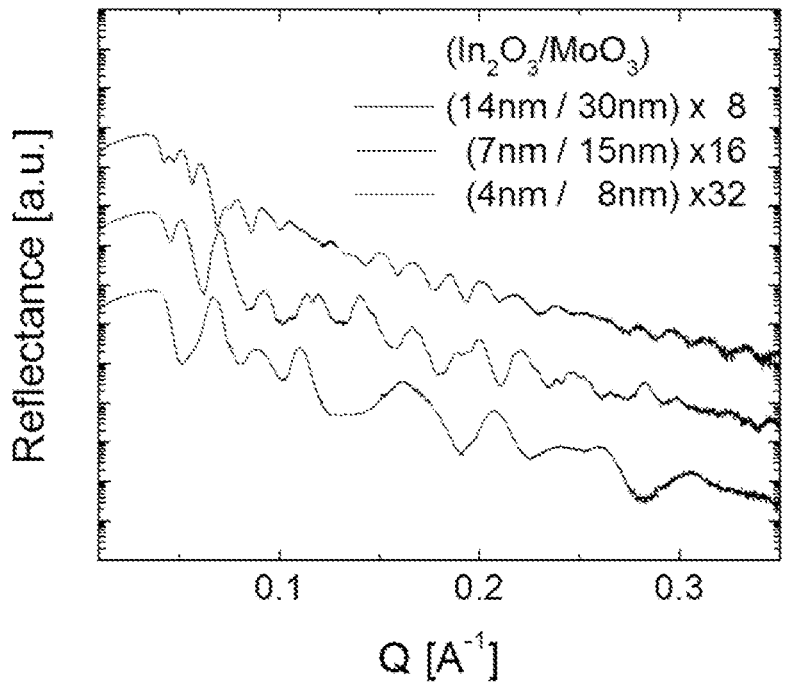
FIGS. 8C-8D show X-ray reflectance plots.

We also performed X-ray reflectance measurements to determine the existence of superlattices. FIG. 8C shows the relative comparison of different layer thicknesses of the $In_2O_3$ layers (Samples #1, #2, and #3). As expected the fringe separations become larger as the $In_2O_3$ layers are brought closer together. For the (4 nm/8 nm)×32 sample (Sample #1), we observe mixed peak separations. The (7 nm/15 nm) sample (Sample #2) was fit to a non-linear equation (FIG. 8D) to determine the scattering length density (FIG. 8E). The plot of the scattering length density unambiguously shows the 16-layered structure.

FIG. 8A shows the theta-2 theta XRD patterns of a 280-nm-thick $In_2O_3$ single layer, a 400-nm-thick $MoO_3$ single layer, and a 7 nm $In_2O_3$-15 nm $MoO_3$ CAML consisting of 16 bilayers (with a total thickness of 352 nm) on a quartz substrate. In the single layer $In_2O_3$ we observe a very sharp and intense peak form the (222) plane at around 30.1° as well as peaks from the (211), (400), (332), (431), (440), (622), and (444) planes. Compared to the reference $In_2O_3$ peak positions (ICDD 00-006-0416 shown as vertical gray lines in FIG. 2 (c)), every peak of 280-nm-thick $In_2O_3$ is shifted to a slightly lower two theta value, which indicates that the lattice of the cubic $In_2O_3$ film is expanded and is therefore bearing some tensile stress. However, the XRD peak positions of the superlattice sample are accurately consistent with the $In_2O_3$ reference peak positions, which indicate no residual strain is present in the stack, as expected due to the alternating nano-layers of crystalline and amorphous films (this is what makes our system unique). The stress relaxation in the 7-nm-thick $In_2O_3$ layers of the multilayer compared to the 288 nm $In_2O_3$ single layer is explained by the following reasoning. The volume shrinkage during grain growth imparts a tensile stress to the film. Since the multilayer has smaller $In_2O_3$ grain sizes due to the much smaller thickness of each 7 nm $In_2O_3$ layer than the a 288 nm $In_2O_3$ single layer, the intrinsic growth stress is smaller in the multilayer case. Moreover, since thin amorphous $MoO_3$ layers are interposed between every 7 nm $In_2O_3$ layer, the $In_2O_3$ layers in the multilayer are nearly free of epitaxial stress which is generated by lattice mismatch to the adjacent layer in fully crystalline systems. For these reasons, the $In_2O_3$ layers in multilayer structure has less residual stress than the thick $In_2O_3$ single layer and the XRD peaks more accurately align with the ICDD reference values. Since the thickness of the sum of the $In_2O_3$ layers in the superlattice is much smaller than the 280 nm $In_2O_3$ single layer sample, and the X-ray intensity is weakened by the existence of $MoO_3$ layers, the height of (222) plane main peak of $In_2O_3$ is smaller in multilayer sample than the single layer case (see inset of FIG. 8A). Moreover, since the thickness of each $In_2O_3$ layer in the CAML is not larger than 7 nm, the grain growth of $In_2O_3$ must be restricted and the crystallite size smaller than the 280 nm $In_2O_3$ single layer, so that the full width at half maximum of the (222) peak was two times larger in the multilayer film. (1.1° vs. 0.5°) However, the $In_2O_3$ XRD peaks are still very large and sharp, and this is consistent with the high crystallinity of $In_2O_3$ layer in the TEM analyses in FIG. 10A and FIG. 10B. The peaks of (332) and (444) of multilayer have just half the intensity ratio compared to the $In_2O_3$ reference values. This indicates that the $In_2O_3$ layers in the superlattice have a preferred (222)-plane orientation, which was discussed in SADP image.

Figure 8D:
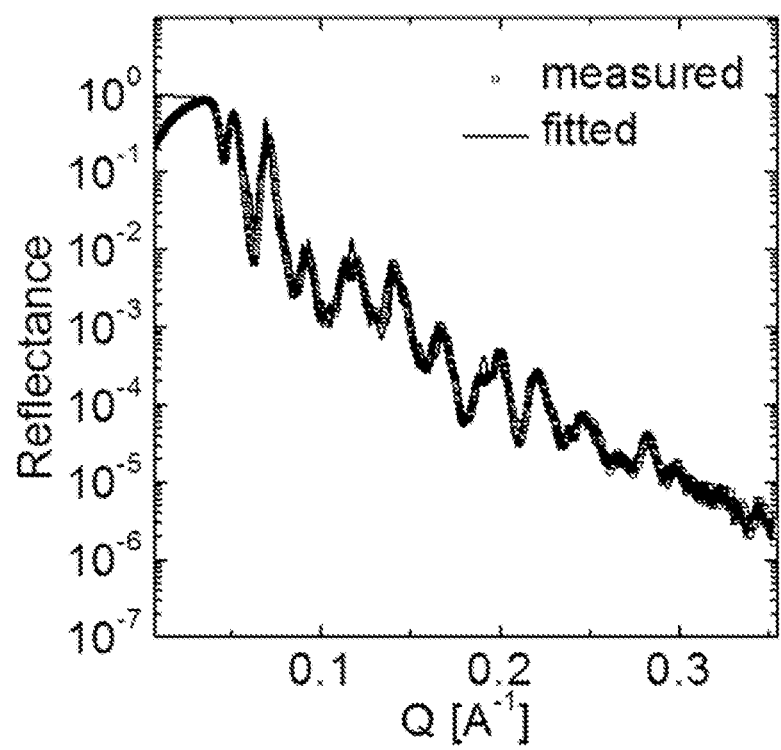
Figure 8E:
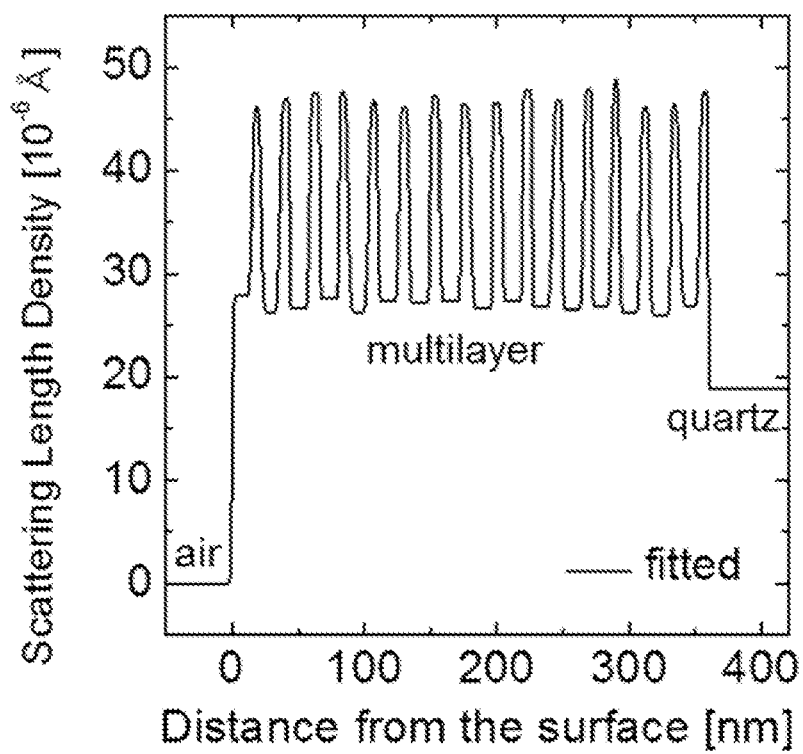
FIG. 8E shows a scatter length density plot obtained from the fit shown in FIG. 8D, showing the multilayered structure of the film.

FIG. 8D shows the X-ray reflectance (XRR) result of the superlattice sample with the equivalent stacking of the sample studied in FIGS. 8A, 10A, and 10B. Despite the complex structure of the stack, and the large total number of units involved (totally 32 layers, with 16 $In_2O_3$ and 16 $MoO_3$), the XRR data is fitted with a high precision, as depicted by the red line in the same graph in FIG. 8D. MOTOFIT software was used to fit the XRR data. (A. Nelson, J. Appl. Crystallogr. 39, 273-276 (2006)) The average thickness of the $In_2O_3$ layers is 7.2 nm (standard deviation of 0.5 nm). The average scattering length density (which is a measure of the electron density) (X.-L. Zhou, Physical Review E 47, 3174-3190 (1993); X.-L. Zhou, Physical Review E 52, 1938-1952 (1995) of $In_2O_3$ is 47.0× $10^{-6}$ Å (standard deviation of $0.8 \times 10^{-6}$ Å), and the density of the deposited $In_2O_3$ is calculated to 6.28 $g/cm^3$. For $MoO_3$, the average thickness, the average scattering length density, and the mass density are 15.3 nm (standard deviation of 0.6 nm), $26.8 \times 10^{-6}$ Å (standard deviation of $0.5 \times 10^{-6}$ Å), and 3.43 $g/cm^3$, respectively. From these results, the mass density ratios of the $In_2O_3$ and $MoO_3$ layers to the theoretical values ($In_2O_3$:7.18 $g/cm^3$, $MoO_3$ 4.69 $g/cm^3$)(14, 15) are calculated to be 87.5% and 73.2%, respectively. The small standard deviations of the fitted value correlate well with the uniformity of the measured thickness in the cross-sectional TEM image in FIGS. 10A and 10B. In addition, the average roughness of the interfaces is about 0.9 nm, which is consistent with the seen in FIG. 10B. The variations of scattering density, roughness, and thickness of each layer from the surface down to the substrate (obtained by the simulation of FIG. 8D) are depicted in FIG. 8E. The scattering length density and thickness of the same material layers are very uniform; the sharp and distinct interfaces between layers are as expected.

Example 9: HR-TEM Measurements

Figure 9A:
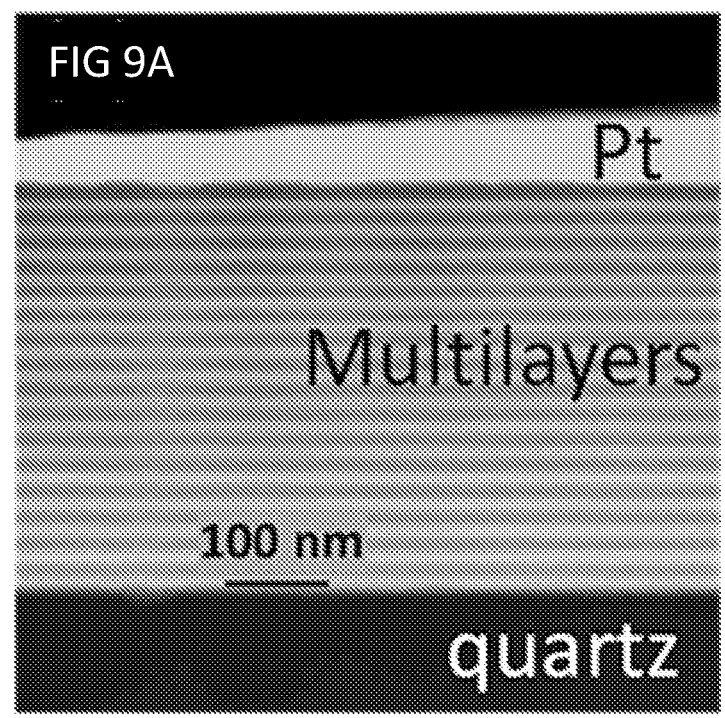

We performed HR-TEM. In FIG. 9A we observe the sharp contrast of the CTS and the ATI layers indicating well-formed separate crystalline and amorphous layers. Also note the very sharp interfaces in FIGS. 9B and 9C with $In_2O_3$ seen as a single crystal. The layers at the top (FIG. 9B) and bottom (FIG. 9C) of the superlattice are indistinguishable. In addition, using EDS we were able to identify the elements contained in the layers (data not shown).

To evaluate the polymorphic superlattice quality, high resolution cross-sectional transmission electron microscopy (HRTEM) and scanning TEM were used. FIG. 10A gives the image of a 16 bilayer stack consisting of 7 nm $In_2O_3$ and 15 nm $MoO_3$. FIG. 10A shows an STEM image; the bright straight lines arise from the $In_2O_3$ which has a larger mass density than the dark $MoO_3$ regions. Note the layers are quite parallel. The inset in FIG. 10A shows the selective area diffraction patterns (SADPs) obtained from the sample. The magnification was controlled so that the whole multilayer oxide region was sampled in SADP image. The diffraction spots indicated by the arrows 'a' and 'b' matched well with the (222) and (211) planes, respectively, of the cubic (bixbyite, space group of IA-3) structure of $In_2O_3$. It is noted that many diffraction patterns, especially the 'a' spots, are positioned at the top-side of the transmitted electron beam. This implies that the sample has strong (222)-texture in the multilayer growth direction. The amorphous ring indicated by the yellow arrow 'c' indicates short-range order in the amorphous $MoO_3$ layers. FIG. 10B shows the higher-magnification bright-field TEM image of the multilayer. Note the sharp interfaces between $In_2O_3$ and $MoO_3$, with minimal interface roughness. In the image on the right-side of FIG. 10B we demonstrate the ability to grow sharp 1 nm $MoO_3$ layers.

Example 10: Growth Rate

To confirm the growth rate of each material, 100 nm $In_2O_3$ and 100 nm $MoO_3$ films were grown individually on different quartz substrates with the growth rates calculated by the XRR fitting result of FIG. 8E ($In_2O_3$:0.023 nm/pulse, $MoO_3$: 0.033 nm/pulse). Stylus profilometer, XRR, and spectral reflectometer measurements of these films showed good agreement (see FIGS. 4A-4F).

Example 11: Electrical Properties

Figure 11A:
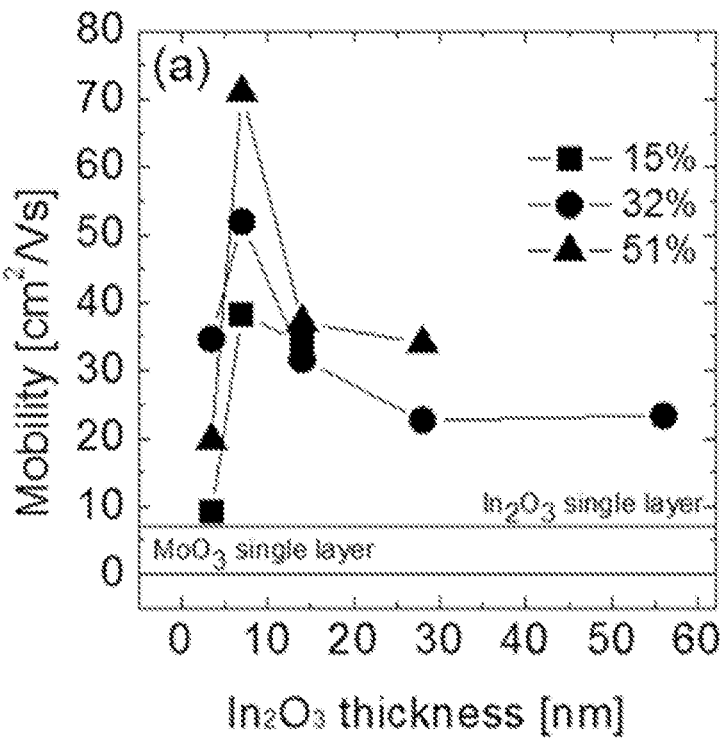
FIGS. 11A-11C show electrical properties of several multilayer films.
Figure 11B:
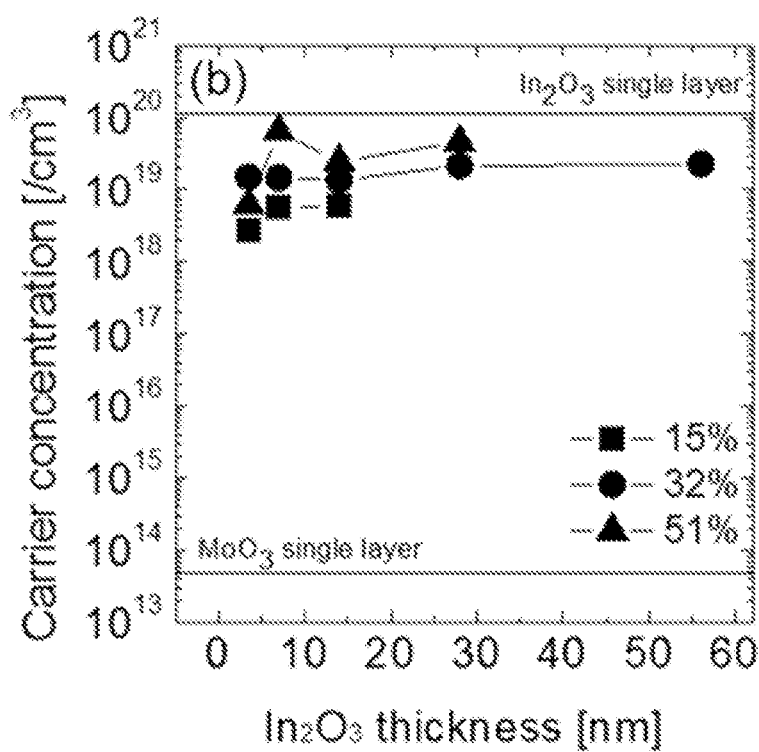
Figure 11C:
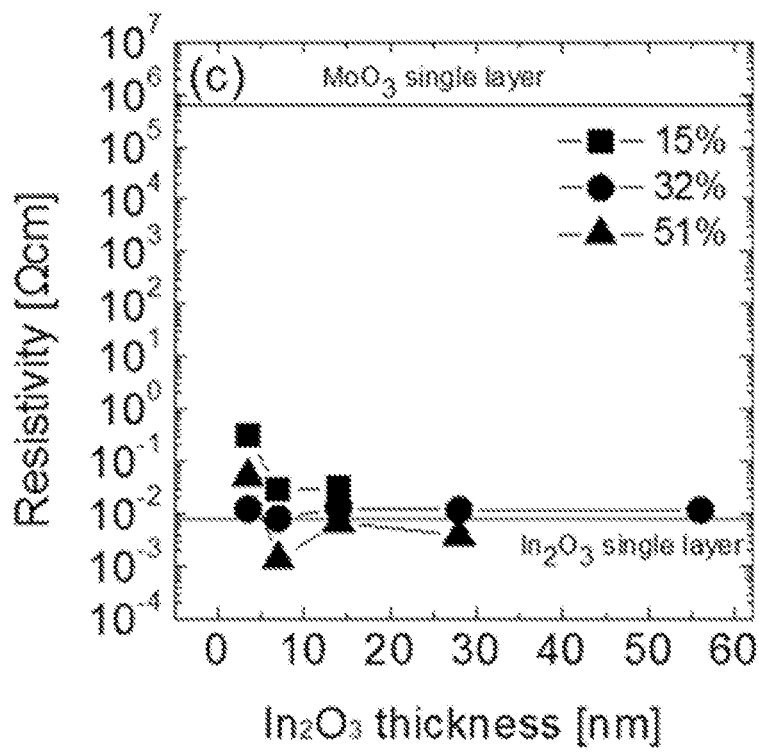

High electrical mobility in a material is always desired to fabricate high performance devices, such as field effect transistors. Mobility can be considered as an indirect measurement of loss in the material due to collisions, recombinations, and scattering of various sorts. For electrical measurements of our superlattice films, we used an Ecopia Hall Instrument. In FIG. 11A a plot of the mobility as a function of $In_2O_3$ layer thicknesses of different concentration of $In_2O_3$ in a ~300 nm thick multi-layer film is shown. When the $In_2O_3$ layer thickness is around 7 nm of the 51% $In_2O_3$, the mobility is nearly over 10 times higher than a pure $In_2O_3$ film of the same total thickness (~300 nm) prepared under same conditions. On the other hand, both the carrier concentration and the resistivity deduced from the measurements are pretty much the same. FIGS. 11B and 11C. The maxim mobility appears only for 51% $In_2O_3$ concentration.

Example 12: Electrical Properties

Figure 12A:
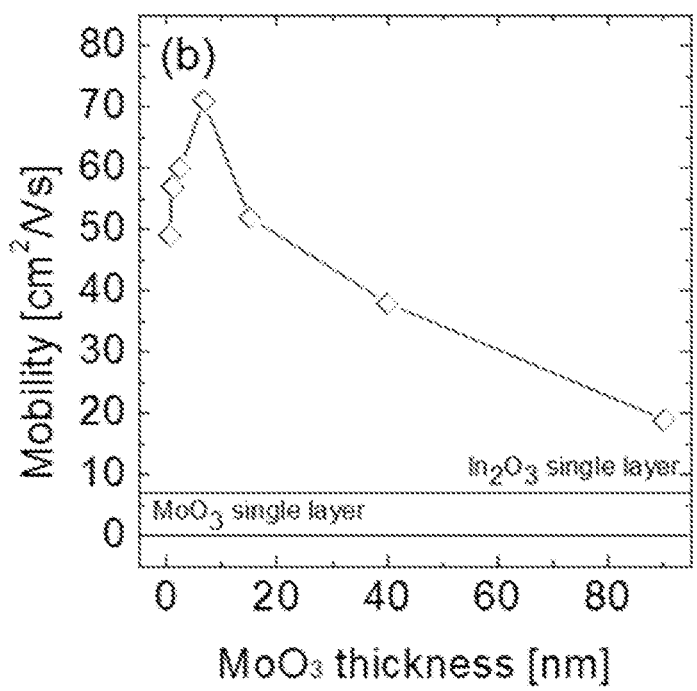
FIGS. 12A-12C show electrical properties of multilayer films at room temperature.

Samples #2, #6, #7, #8, and #9 were tested for the comparative electrical properties. FIGS. 12A-112C show the electrical properties of the superlattice and the single layer films on a quartz substrate. Measurements were performed with the Van der Pauw method for mobility, Hall carrier concentration, and resistivity. The carriers are n-type for all samples. The electrical properties for the 280 nm $In_2O_3$ and 400 nm $MoO_3$ single layers are depicted in purple in the figure. While the $In_2O_3$ single layer film was a relatively good conductor (resistivity ~$8 \times 10^{-3}$ Ω-cm), the single $MoO_3$ film had insulating properties with a resistivity above $10^5$ Ω-cm. FIGS. 12A-112C show the mobility, carrier concentration, and resistivity respectively. The mobility of the superlattice was highest when the $In_2O_3$ thickness was 7 nm (See also, FIG. 11A). For the consistent $In_2O_3$ thickness of 7 nm we observed a peak mobility of about 70 cm$^2$/Vs with 24 units in the stack (Sample #8) (FIG. 12A). Moreover, in comparison with the pure single $In_2O_3$ or $MoO_3$ samples, the mobility of superlattice was always higher than either layer individually. On the other hand, the carrier concentration of the superlattice was $10^{18}$~$10^{20}$/cm$^3$ which is between that of the $In_2O_3$ ($1.2 \times 10^{20}$/cm$^3$) and $MoO_3$ ($4.9 \times 10^{13}$/cm$^3$) single layers.

Figure 12B:
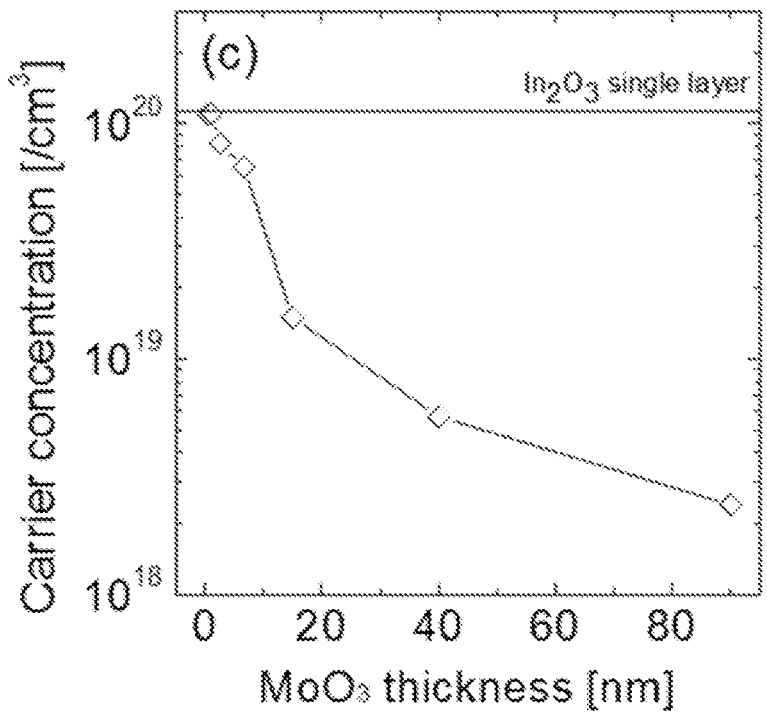
Figure 12C:
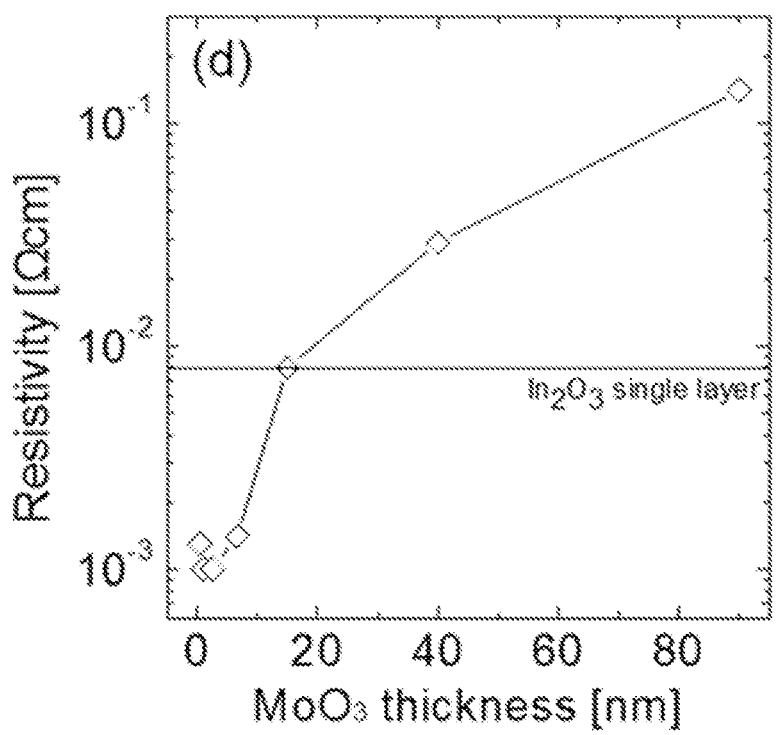

We note clearly from FIG. 12A that the mobility falls rapidly as the $MoO_3$ layer thickness increases. This increase in layer width, allows the rapid development of dislocation driven loops within the layer that result in high electrical resistivity in the layer deteriorating its performance dramatically. This is an important relationship between structural and electrical properties of the superlattice. For the samples with the smallest $MoO_3$ thicknesses, the electrical behavior is dominated by $In_2O_3$ when the superlattice has a a high density of this material (i.e., between 70% and 93%) for fixed total thicknesses. FIGS. 12B and 12C show that the Hall carrier concentration and the resistivity of the sample are plotted and compared with single layer values of $In_2O_3$.

Example 13: Elastic and Hardness Properties

Figure 13A:
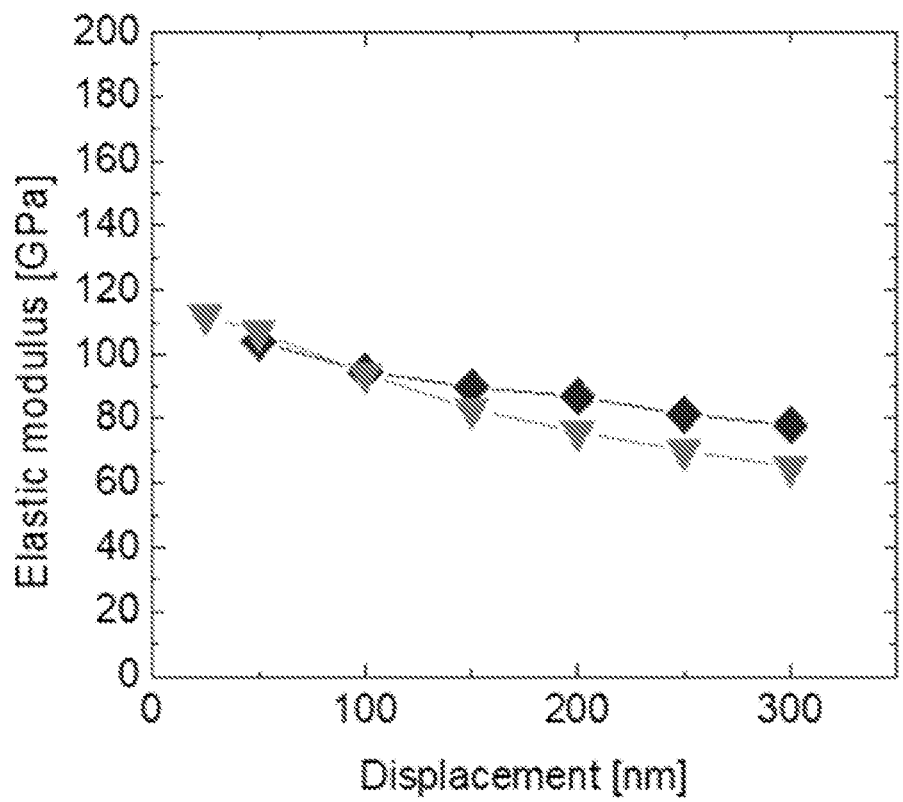
FIGS. 13A-13D show nanoindentation measurements of different samples.
Figure 13B:
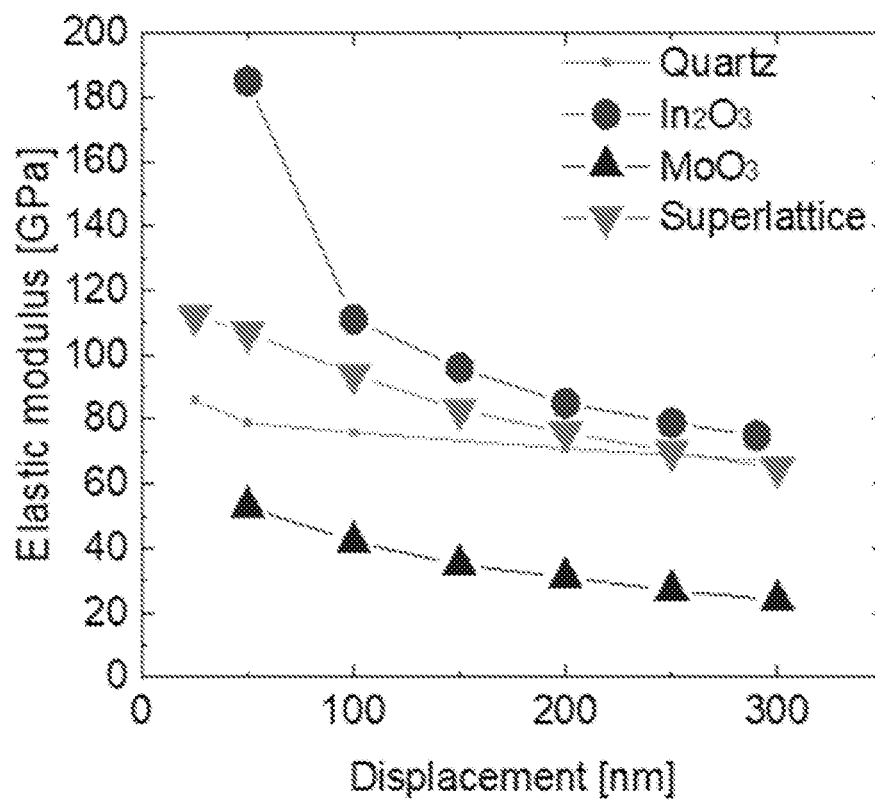
Figure 13C:
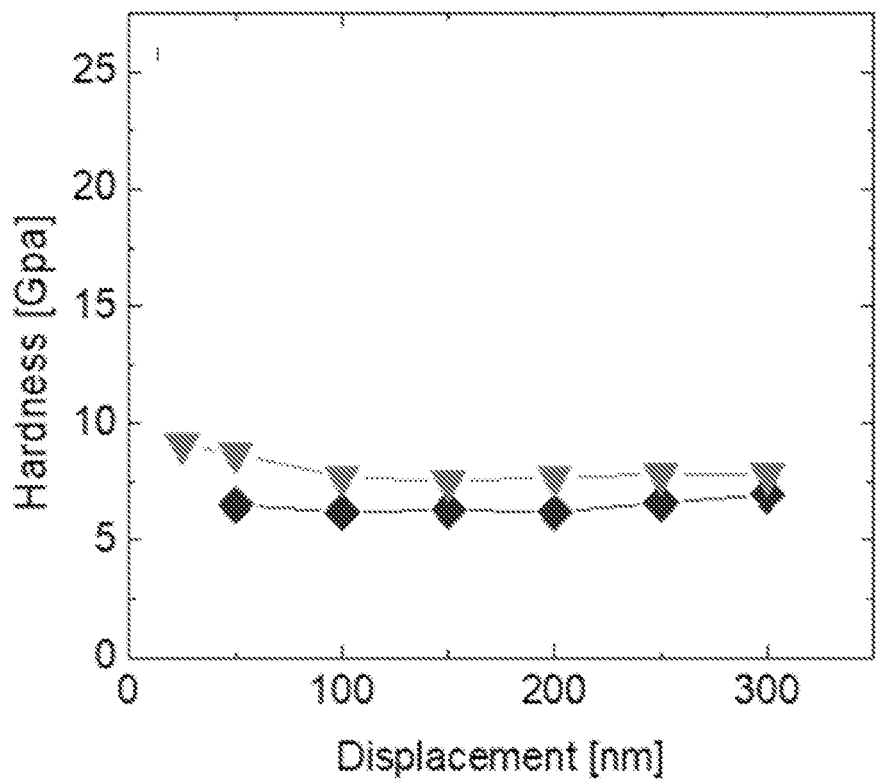
Figure 13D:
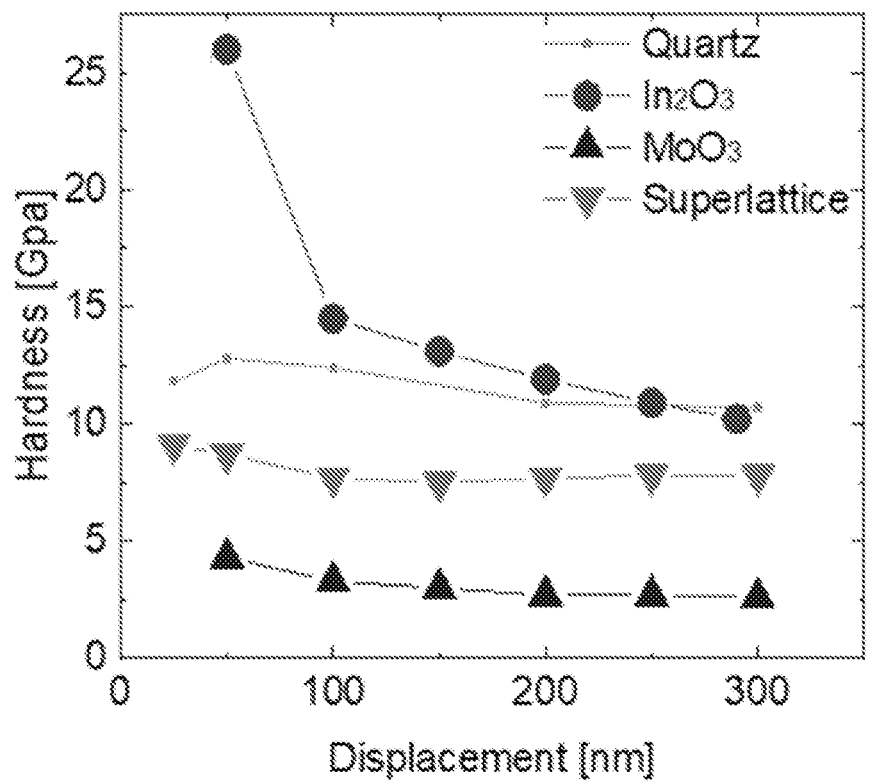

The hardness and elastic modulus of a 24 bilayer, 8 nm $In_2O_3$-5 nm $MoO_3$ was evaluated according to ASTM nanoindentation protocol using a standard Hysitron Triboindentor with a Berkovich tip (135 nm radius). FIGS. 13A and 13C show elastic modulus and hardness as measured by two independent laboratories, respectively. FIGS. 13B and 13D show elastic modulus and hardness measuremens for the 24 bilayer sample compared to 350 nm thick $In_2O_3$ and $MoO_3$ samples.

We claim:

1. A method for preparing a superlattice, the method comprising:
   (a) providing a chamber having a first material and a second material therein;
   (b) positioning the first material in an irradiation zone within the chamber;
   (c) irradiating the first material in the irradiation zone for an effective time to deposit a layer of the first material at a first deposition rate;
   (d) positioning the second material in the irradiation zone;
   (e) irradiating the second material in the irradiation zone for an effective time to deposit a layer of the second material at a second deposition rate; and
   (f) repeating steps (b)-(e) a multiplicity of times, thereby forming an alternating superlattice of layers of the first material and the second material,
   wherein the ratio of the first deposition rate to the second deposition rate is between 1.0:2.0 and 2.0:1.0 and
   wherein the first material is selected from a crystalline semiconductive material and the second material is selected from an amorphous insulating material.

2. The method of claim 1, wherein the effective time to deposit the layer of the first material results in a layer of the first material between 0.1 nm and 50.0 nm thick or the effective time to deposit the layer of the second material results in a layer of the second material between 0.1 nm and 50.0 nm thick.

3. The method of claim 2, wherein the effective time to deposit the layer of the first material results in a layer of the first material between 0.1 nm and 10.0 nm thick and the effective time to deposit the layer of the second material results in a layer of the second material between 0.1 nm and 10.0 nm thick.

4. The method of claim 1, wherein the first material and the second material are transparent materials.

5. The method of claim 1, wherein the first material is a crystalline transparent semiconducting material and the second material is an amorphous transparent insulating material.

6. The method of claim 5, wherein the crystalline transparent semiconducting material comprises a transparent conducting oxide, a transparent conducting nitride, a transparent conducting carbide, or a transparent conducting chalcogenite.

7. The method of claim 6, wherein the crystalline transparent semiconducting material comprises $In_2O_3$.

8. The method of claim 5, wherein the amorphous transparent insulating material comprises an insulating oxide.

9. The method of claim 8, wherein the amorphous transparent insulating material comprises $MoO_3$.

10. The method of claim 1, wherein the first material is $In_2O_3$ and the second material is $MoO_3$.

* * * * *